United States Patent
Kim et al.

(10) Patent No.: US 10,177,155 B2
(45) Date of Patent: *Jan. 8, 2019

(54) METHOD OF MANUFACTURING SEMICONDUCTOR DEVICES HAVING CONTACT PLUGS OVERLAPPING ASSOCIATED BITLINE STRUCTURES AND CONTACT HOLES

(71) Applicant: SAMSUNG ELECTRONICS CO., LTD., Suwon-si, Gyeonggi-d (KR)

(72) Inventors: Jun-Kyum Kim, Pohang-si (KR); Jung-Woo Seo, Hwaseong-si (KR); Sung-Un Kwon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/716,230

(22) Filed: Sep. 26, 2017

(65) Prior Publication Data

US 2018/0019246 A1    Jan. 18, 2018

Related U.S. Application Data

(60) Continuation of application No. 15/288,228, filed on Oct. 7, 2016, now Pat. No. 9,786,672, which is a division of application No. 14/754,040, filed on Jun. 29, 2015, now Pat. No. 9,490,256.

(30) Foreign Application Priority Data

Aug. 21, 2014   (KR) .................. 10-2014-0109042

(51) Int. Cl.
| | |
|---|---|
| *H01L 29/00* | (2006.01) |
| *H01L 27/108* | (2006.01) |
| *H01L 21/768* | (2006.01) |

(52) U.S. Cl.
CPC .. *H01L 27/10885* (2013.01); *H01L 21/76879* (2013.01); *H01L 27/10814* (2013.01); *H01L 27/10817* (2013.01); *H01L 27/10823* (2013.01); *H01L 27/10855* (2013.01); *H01L 27/10876* (2013.01); *H01L 27/10891* (2013.01)

(58) Field of Classification Search
CPC ......... H01L 27/10876; H01L 27/10814; H01L 27/10885; H01L 27/10891; H01L 27/10823; H01L 21/76879; H01L 27/10817
USPC ........................................................ 257/532
See application file for complete search history.

(56) References Cited

U.S. PATENT DOCUMENTS

| | | |
|---|---|---|
| 5,064,777 A | 11/1991 | Dhong et al. |
| 5,742,086 A | 4/1998 | Rostoker et al. |
| 5,789,770 A | 8/1998 | Rostoker et al. |
| 5,858,829 A | 1/1999 | Chen |
| 6,342,420 B1 | 1/2002 | Nishimura et al. |
| 6,407,434 B1 | 6/2002 | Rostoker et al. |

(Continued)

FOREIGN PATENT DOCUMENTS

KR    10201300089120    8/2013

*Primary Examiner* — Luan C Thai
(74) *Attorney, Agent, or Firm* — Myers Bigel, P.A.

(57) ABSTRACT

A semiconductor device can include a plurality of landing pads arranged according to a layout on a substrate, wherein a cross-sectional shape of each of the landing pads has a diamond shape so that opposing interior angles of the diamond shape are equal to one another and adjacent interior angles of the diamond shape are unequal to one another.

20 Claims, 31 Drawing Sheets

(56) References Cited

U.S. PATENT DOCUMENTS

| | | |
|---|---|---|
| 6,737,714 B2 | 5/2004 | Masuda et al. |
| 6,839,265 B2 | 1/2005 | Keeth |
| 6,902,998 B2 | 6/2005 | Lee et al. |
| 6,977,197 B2 | 12/2005 | Park et al. |
| 7,365,385 B2 | 4/2008 | Abbott |
| 7,749,834 B2 | 7/2010 | Park et al. |
| 7,833,902 B2 | 11/2010 | Lee |
| 8,389,360 B2 | 3/2013 | Abbott |
| 8,409,955 B2 * | 4/2013 | Fujimoto .......... H01L 27/10876 257/E21.396 |
| 8,546,258 B2 | 10/2013 | Kim et al. |
| 8,581,314 B2 | 11/2013 | Park et al. |
| 8,742,494 B2 | 6/2014 | Wu |
| 8,865,547 B2 | 10/2014 | Kang |
| 9,202,775 B2 | 12/2015 | Jung et al. |
| 2012/0132970 A1 | 5/2012 | Park et al. |
| 2012/0135579 A1 | 5/2012 | Park et al. |
| 2013/0069170 A1 | 3/2013 | Blatchford |
| 2014/0077333 A1 | 3/2014 | Son |
| 2015/0004774 A1 | 1/2015 | Kang |
| 2015/0132942 A1 | 4/2015 | Kim et al. |

* cited by examiner

METHOD OF MANUFACTURING SEMICONDUCTOR DEVICES HAVING CONTACT PLUGS OVERLAPPING ASSOCIATED BITLINE STRUCTURES AND CONTACT HOLES

CROSS-REFERENCE TO RELATED APPLICATIONS

This application is a continuation of U.S. patent application Ser. No. 15/288,228, filed Oct. 7, 2016, which itself is a divisional of U.S. patent application Ser. No. 14/754,040, filed Jun. 29, 2015, which itself claims the benefit of Korean Patent Application No. 10-2014-0109042, filed on Aug. 21, 2014, in the Korean Intellectual Property Office, the disclosures of which are incorporated herein in their entireties by reference.

BACKGROUND

The inventive concept relates to semiconductor devices and methods of manufacturing the same, and more particularly, to semiconductor devices having contact plugs and methods of manufacturing the same.

A high degree of integration of semiconductor devices in electronic devices can lead to decreased design rules for elements of the semiconductor devices. When forming contact plugs for connecting upper elements and lower elements in highly integrated semiconductor devices, bridging between the contact plugs, or necking (i.e., thinning of a portion of the contact plugs) may occur, which can lead to a deterioration in reliability of the semiconductor devices.

SUMMARY

Embodiments according to the invention can provide semiconductor devices having contact plugs overlapping associated bit line structures and contact holes and methods of forming the same. Pursuant to these embodiments, a semiconductor device can include a plurality of landing pads arranged according to a layout on a substrate, wherein a cross-sectional shape of each of the landing pads has a diamond shape so that opposing interior angles of the diamond shape are equal to one another and adjacent interior angles of the diamond shape are unequal to one another.

In some embodiments according to the inventive concept, a first diagonal of the diamond shape that bisects a first pair of the opposing interior angles has a different length than a second diagonal of the diamond shape that bisects a second pair of the opposing interior angles. In some embodiments according to the inventive concept, each of the landing pads is included in a contact plug that is electrically connected to an underlying active area of the substrate.

In some embodiments according to the inventive concept, wherein an upper portion of each of the landing pads is electrically connected to a lower electrode of a respective capacitor. In some embodiments according to the inventive concept, each of the landing pads overlaps a bit line structure and an adjacent contact hole associated with the respective capacitor.

In some embodiments according to the inventive concept, a portion of each of the landing pads that overlaps the contact hole partially fills the contact hole so that a remaining portion of the contact hole adjacent a neighboring bit line structure is unoccupied by the portion of each of the landing pads that overlaps the contact hole. In some embodiments according to the inventive concept, a first and a second of the landing pads are electrically connected to the underlying active area in the substrate. In some embodiments according to the inventive concept, the first and second landing pads are positioned asymmetrically relative to the underlying active area.

In some embodiments according to the inventive concept, a semiconductor device can include a substrate having a plurality of active areas, a plurality of bit line structures formed on the substrate, each comprising a bit line extending in a first direction and a bit line spacer layer extending along two opposing side surfaces of the bit line, a plurality of contact holes spaced apart from one another in a lengthwise direction in a space between ones of the plurality of bit line structures, a plurality of first contact plugs filling respective bottom portions of the plurality of contact holes and electrically connected with respective ones of the plurality of active areas, and a plurality of second contact plugs electrically connected with respective ones of the plurality of first contact plugs, and on the respective ones of the plurality of bit line structures, wherein the plurality of second contact plugs are laid out on respective upper surfaces of the plurality of bit line structures in a hexagonal array structure and wherein each of the second contact plugs has a diamond-shaped cross-sectional plane.

In some embodiments according to the inventive concept, the plurality of second contact plugs each comprise a body portion and an extension portion extending from the body portion into a respective one of the plurality of contact holes and the diamond-shaped cross-sectional plane is included in the body portion.

In some embodiments according to the inventive concept, a diagonal line of the body portion with respect to the diamond-shaped cross-sectional plane extends in the first direction. In some embodiments according to the inventive concept, lengths of two diagonal lines of the body portion with respect to the diamond-shaped cross-sectional plane are different from each other. In some embodiments according to the inventive concept, the cross-sectional plane of the body portion has a round-edged diamond shape.

In some embodiments according to the inventive concept, a plurality of body portions are alternately arranged to alternately overlap two opposing side surfaces of one of the bit line structures in the first direction. In some embodiments according to the inventive concept, each body portion overlaps a portion of a respective one of the plurality of bit line structures and overlaps a portion of a respective one of the plurality of contact holes, in a direction perpendicular to a main surface of the substrate.

In some embodiments according to the inventive concept, three of four edges of the diamond-shaped cross-sectional plane of the body portion overlap the respective one of the plurality of bit line structures. In some embodiments according to the inventive concept, the body portions of two of the plurality of second contact plugs that correspond to one of the plurality of active areas, have different size areas that overlap the corresponding one of the plurality of active areas.

In some embodiments according to the inventive concept, a semiconductor device can include a substrate having a plurality of active areas, a plurality of bit line structures formed on the substrate, each comprising a bit line extending in a first direction and a bit line spacer layer extending along two side surfaces of the bit line, a plurality of first contact plugs spaced apart from one another in a lengthwise direction of a space between ones of the plurality of bit line structures, and electrically connected with respective ones of the plurality of active areas, and a plurality of second contact plugs electrically connected with respective ones of the plurality of first contact plugs and on respective ones of the plurality of bit line structures, wherein two of the plurality of second contact plugs corresponding to one of the plurality of active areas, have different size areas overlapping the one of the plurality of active areas in a direction that is perpendicular to a main surface of the substrate.

In some embodiments according to the inventive concept, the plurality of second contact plugs overlap respective portions of the plurality of bit line structures and respective portions of the plurality of first contact plugs in the direction perpendicular to the main surface of the substrate, and respective portions of the plurality of second contact plugs, which are arranged on upper surfaces of the respective ones of the plurality of bit line structures to have an area that overlaps the plurality of bit line structures, which is greater than an area thereof overlapping the plurality of first contact plugs.

In some embodiments according to the inventive concept, a method of manufacturing a semiconductor device, can include preparing a substrate having a plurality of active areas, forming a plurality of bit line structures on the substrate and each comprising a bit line extending in a first direction and a bit line spacer layer extending along two opposing side surfaces of the bit line, forming a plurality of contact holes spaced apart from one another along a lengthwise direction of a space between the plurality of bit line structures, and a plurality of first contact plugs filling bottom portions of the plurality of contact holes and electrically connected with the plurality of active areas, forming a conductive material layer to fill the plurality of contact holes and to cover the plurality of bit line structures, forming a plurality of first line patterns extending to form a diagonal line with respect to the first direction and arranged on the conductive material layer, and a plurality of second line patterns arranged on the plurality of first line patterns and crossing the plurality of first line patterns, and forming a plurality of second contact plugs each electrically connected with respective ones of the plurality of first contact plugs, by etching the conductive material layer using the plurality of first line patterns and the plurality of second line patterns as an etch mask.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Figure 1:
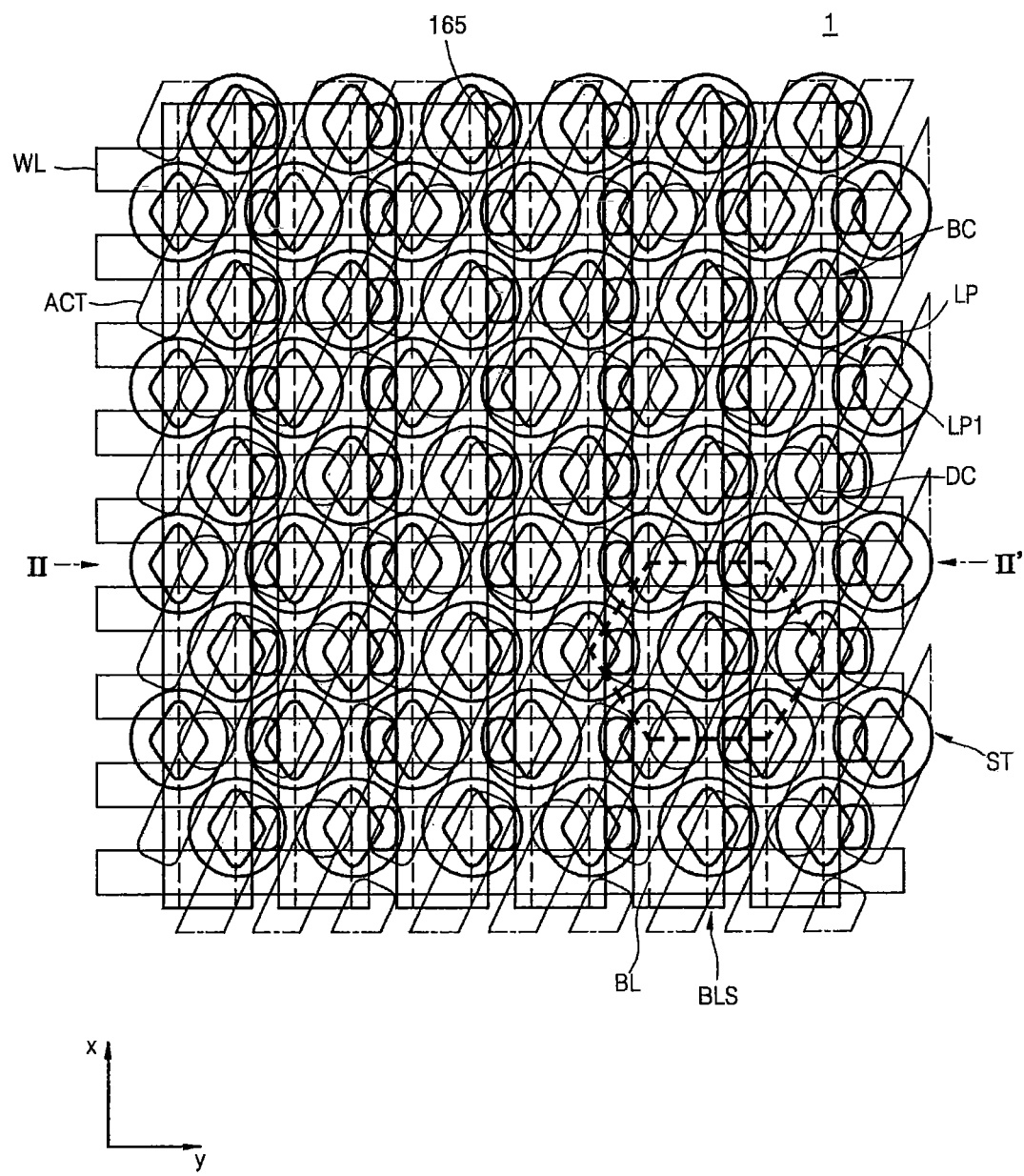
FIG. 1 is a layout of a semiconductor device according to some embodiments.

Hereinafter, the inventive concept is described with reference to the accompanying drawings, in which exemplary embodiments of the inventive concept are shown. Like reference numerals in the drawings denote like elements, and a repeated explanation may not be given of overlapping features or like elements. As used herein, the term "and/or" includes any and all combinations of one or more of the associated listed items.

These inventive concept may, however, be embodied in different forms and should not be construed as limited to the embodiments set forth herein. Rather, these embodiments are provided so that this disclosure is thorough and complete and fully conveys the inventive concept to those of ordinary skill in the art.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments. For example, a first element could be termed a second element, and, similarly, a second element could be termed a first element, without departing from the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When an exemplary embodiment may be implemented differently, a specific process order may be performed differently from the described order. For example, two consecutively described processes may be performed substantially at the same time or performed in an order opposite to the described order.

In the drawings, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

Throughout this specification, the term "angle" denotes an acute angle, unless otherwise defined or shown. For example, in the expressions "a major axis has a first angle with respect to a first direction," and "a line pattern extends by a second angle with respect to a first direction," the first and second angles denote the acute angle.

In this specification, the term "overlap" denotes to overlap in a direction perpendicular to a main surface of a substrate, unless otherwise defined or shown.

FIG. 1 is a layout of a semiconductor device 1 according to some embodiments.

Referring to FIG. 1, the semiconductor device 1 includes a plurality of active areas ACT. Each of the plurality of active areas ACT may have a relatively long island shape with a minor axis and a major axis. Each of the plurality of active areas ACT may have a major axis extending in a direction diagonal with respect to a first direction (direction x). A plurality of word lines WL extend in parallel with one another along a second direction (direction y) across the plurality of active areas ACT. The plurality of word lines WL may be arranged at equal intervals. On the plurality of word lines, a plurality of bit lines BL extend in parallel with one another along the first direction (direction x) which is perpendicular to the second direction (direction y). Each of the plurality of bit lines BL and a bit line spacer layer extending along two side surfaces of the bit line may form a bit line structure BLS. That is, the bit line structure BLS excluding the bit line BL may correspond to the bit line spacer layer. The bit line structures BLS may extend in parallel with one another along the first direction (direction x).

The plurality of bit lines BL are connected with the plurality of active areas ACT through a plurality of direct contacts DC. Each of the plurality of active areas ACT may be electrically connected with a respective one of the plurality of direct contacts DC.

A plurality of buried contacts BC may be formed in a region between two adjacent bit line structures BLS from among the plurality of bit line structures BLS. In some embodiments, the plurality of buried contacts BC may be arranged spaced apart from one another along a lengthwise direction of the space between the two adjacent bit line structures BLS, that is, the first direction (direction x). A portion of the space between the two adjacent bit line structures BLS, in which the plurality of buried contacts BC are not formed, may be filled with a plurality of insulating patterns 165. The plurality of buried contacts BC may have a matrix array structure in which the plurality of buried contacts BC are arranged in series along the first direction (direction x) and the second direction (direction y). In some embodiments, the plurality of buried contacts BC may be arranged at equal intervals along the first direction (direction x).

The plurality of buried contacts BC may electrically connect a storage node ST which is a lower electrode of a capacitor to the plurality of active areas ACT. Each of the plurality of active areas ACT may be electrically connected with two buried contacts BC.

A plurality of landing pads LP may be arranged on the bit line structure BLS such that each of the plurality of landing pads LP is also electrically connected with each of the plurality of buried contacts BC. The plurality of landing pads LP may electrically connect the storage node ST which is a lower electrode of a plurality of capacitors with the plurality of active areas ACT. The storage node ST may be electrically connected with the plurality of active areas ACT though the plurality of buried contacts BC and the plurality of landing pads LP.

One from among the plurality of buried contact BC and one from among the plurality of landing pad LP, corresponding to each other, may be referred to as a contact plug. The buried contact BC and the landing pad LP may be referred to as a first contact plug BC and a second contact plug LP, respectively. That is, the first contact plug BC and the second contact plug LP may electrically connect the storage node ST with the plurality of active areas ACT.

A portion LP1 of the second contact plug LP may be arranged on an upper surface of the bit line structure BLS. The portion of the second contact plug LP that is arranged on the upper surface of the bit line structure BLS may be referred to as a body portion LP1 and the other portion may be referred to as an extension portion (refer to LP2 of FIG. 2).

A cross-sectional plane of the body portion LP1 of the second contact plug LP may have a diamond shape. The body portion LP1 of the second contact plug LP may have a diagonal line with respect to the diamond-shaped cross-sectional plane, the diagonal line (refer to DN1 of FIG. 16) extending in the first direction (direction x extending between opposing corners). The body portion LP1 of the second contact plug LP may have the other diagonal line with respect to the diamond-shaped cross-sectional plane, the other diagonal line extending (refer to DN2 of FIG. 16) in the second direction (direction y extending between opposite corners). Lengths of the two diagonal lines of the body portion LP1 of the second contact plug LP with respect to the diamond-shaped cross-sectional plane may be different from each other. The cross-sectional plane of the body portion LP1 of the second contact plug LP may have a round-edged diamond shape.

The body portion LP1 of the second contact plug LP may have an area overlapping the bit line structure BLS, which is greater than an area overlapping the first contact plug BC. Three from among four edges of the diamond shape of the cross-sectional plane of the body portion LP1 of the second contact plug LP may overlap the bit line structure BLS.

The body portions LP1 of the plurality of second contact plugs LP may be arranged to have a hexagonal array structure. The body portions LP1 of the plurality of second contact plugs LP may be alternately arranged such that the body portions LP1 alternately overlap two side surfaces of the bit line structure BLS along the first direction (direction x).

The body portions LP1 of two second contact plugs LP corresponding to (overlapping) one from among the plurality of active areas ACT, may have different size areas overlapping the one from among the plurality of active areas ACT. The body portions LP1 of two second contact plugs LP corresponding to (overlapping) one from among the plurality of active areas ACT, may be arranged on different bit line structures BLS. The body portions LP1 of two second contact plugs LP corresponding to (overlapping) one from among the plurality of active areas ACT, may be arranged on two adjacent bit line structures BLS, respectively. The body portions LP1 of two second contact plugs LP corresponding to (overlapping) one from among the plurality of active areas ACT, may be arranged such that the body portions LP1 overlap corresponding side surfaces of different bit line structures BLS.

The body portions LP1 of two second contact plugs LP corresponding to (overlapping) one from among the plurality of active areas ACT, may overlap an identical side surface of the one from among the plurality of active areas ACT, from among two side surfaces thereof, the two side surfaces being based on a major axis of the one from among the plurality of active areas ACT.

A column formed by the body portions LP1 along an extension line connecting the body portions LP1 may be arranged along a direction that is different from a direction of the major axis of the one from among the plurality of active areas ACT.

Two first contact plugs BC corresponding to one from among the plurality of active areas ACT, may have a symmetrical shape based on a center of the one from among the plurality of active areas ACT. Two second contact plugs LP corresponding to one from among the plurality of active areas ACT, may have an asymmetrical shape based on a center of the one from among the plurality of active areas ACT.

The plurality of second contact plugs LP may be arranged to form a row in the second direction (direction y) which is perpendicular to the first direction (direction x). The plurality of second contact plugs LP may be arranged to overlap corresponding side surfaces of (the same direction) of the plurality of bit line structures BLS.

Each of a plurality of storage nodes ST may be arranged on the second contact plug LP as a hexagonal array structure. An area of a lower surface of the storage node ST may be greater than an area of an upper surface of the second contact plug LP.

Although elements around edges may be omitted or cut in the layout of FIG. 1 and later layouts, this is only for convenience of illustration. The arrangement and shape of the elements are not limited thereto.

Figure 2:
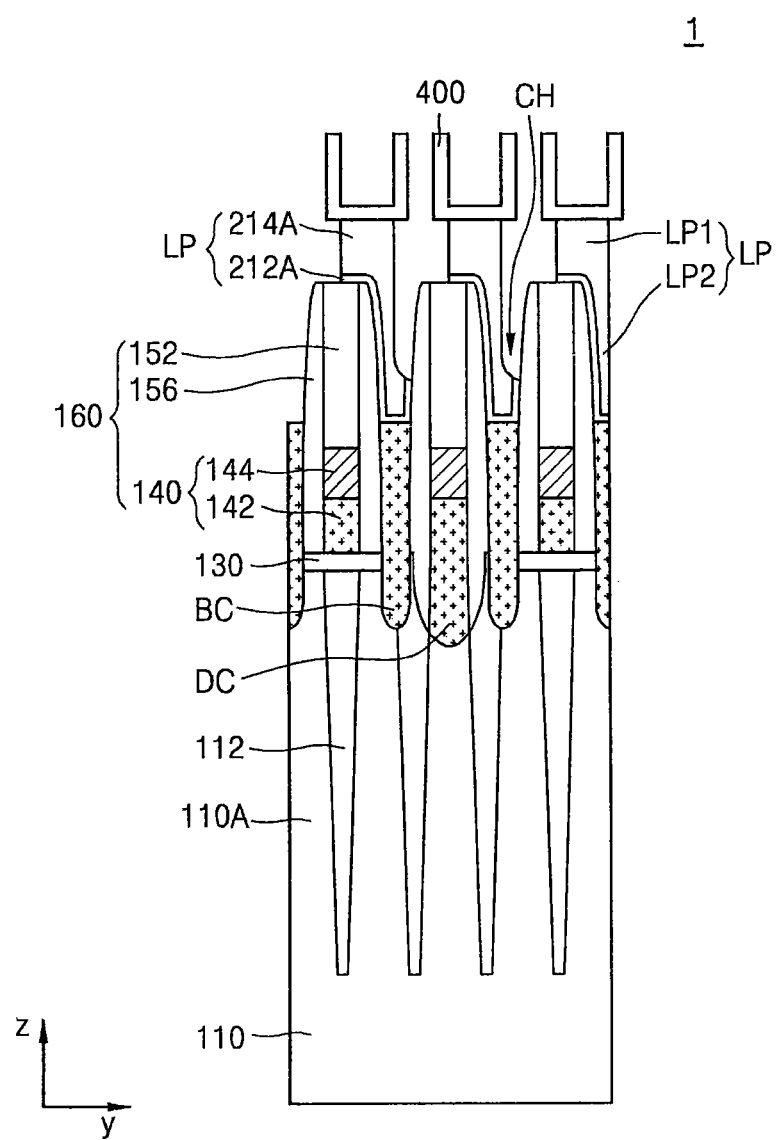
FIG. 2 is a cross-sectional view of some elements of a semiconductor device according to some embodiments.

FIG. 2 is a cross-sectional view of some elements of a semiconductor device according to an exemplary embodiment. FIG. 2 is a cross-sectional view taken along a line II-II' of FIG. 1.

Referring to FIGS. 1 and 2, a device separating layer 112 is formed on a substrate 110 and a plurality of active areas 110A is defined on the substrate 110 by the device separating layer 112. Each of the plurality of active areas 110A may have a relatively long island shape with a minor axis and a major axis, as each of the plurality of active areas ACT illustrated in FIG. 1.

The substrate 110 may include, for example, silicon (Si). Alternatively, the substrate 110 may include a semiconductor element, such as germanium (Ge), or a compound semiconductor, such as silicon carbide (SiC), gallium arsenide (GaAs), indium arsenide (InAs), and indium phosphide (InP). Alternatively, the substrate 110 may have a silicon on insulator (SOI) structure. For example, the substrate 110 may include a buried oxide (BOX) layer. The substrate 110 may include a conductive area, for example, a well doped with impurities or a structure doped with impurities.

The device separating layer 112 may be formed of, for example, a material including at least one selected from a silicon oxide layer, a silicon nitride layer, and a silicon oxynitride layer. The device separating layer 112 may be formed as a single layer formed of one type of insulating layer, a double layer formed of two types of insulating layers, or a multi-layer formed of a combination of at least three types of insulating layers. For example, the device separating layer 112 may be formed of two different types of insulating layers. For example, the device separating layer 112 may be formed of a silicon oxide layer and a silicon nitride layer. For example, the device separating layer 112 may be formed as a triple layer formed of a silicon oxide layer, a silicon nitride layer, and a silicon oxide layer.

After the device separating layer 112 is formed, a plurality of word lines (refer to WL of FIG. 1) are formed. The word lines WL will be described in detail with reference to FIG. 4B.

A source/drain area may be formed on some upper portions of the plurality of active areas 110A. To form the source/drain area, impurity ions may be loaded onto the substrate 110.

An insulating layer pattern 130 in which a plurality of openings are formed may be formed on the substrate 110. The insulating layer pattern 130 may be formed to have a thickness of about 200 Å to about 400 Å. The insulating layer pattern 130 may include silicon oxide.

A plurality of direct contacts DC which may be electrically connected with the plurality of active areas 110A are formed by filling the plurality of openings formed in the insulating layer pattern 130 with a conductive material.

A plurality of bit line structures 160 extending in parallel with one another are formed on the insulating layer pattern 130 and the plurality of direct contacts DC. Each bit line structure 160 includes a bit line 140, an insulating capping layer 152 covering an upper surface of the bit line 140, and a bit line spacer layer 156 covering side walls of the bit line 140 and the insulating capping layer 152. The plurality of bit lines 140 may be electrically connected with the plurality of direct contacts DC.

In some embodiments, the bit line 140 may include at least one material selected from a semiconductor doped with impurities, a metal, conductive metal nitride, and metal silicide. In some embodiments, the bit line 140 may be formed as a stack of a first conductive layer 142 and a second conductive layer 144. The first conductive layer 142 may be formed of, for example, doped polysilicon. The second conductive layer 144 may be formed of, for example, a metal or metal nitride, such as W or TiN. Metal silicide, for example, may be further formed between the first conductive layer 142 and the second conductive layer 144.

The insulating capping layer 152 may be formed of, for example, a silicon nitride layer. A thickness of the insulating capping layer 152 may be greater than a thickness of the bit line 140.

The bit line spacer layer 156 may be formed of, for example, a silicon oxide layer, a silicon nitride layer, air, or a combination thereof. In FIG. 2, it is illustrated that the bit line spacer layer 156 is formed as a single layer. However, the present inventive concept is not limited thereto, and the bit line spacer layer 156 may be formed as a double layer, triple layer or more.

The plurality of bit line structures 160 may extend in parallel with one another along the first direction (direction x), as the plurality of bit line structures BLS illustrated in FIG. 1.

A line shaped space, a width of which along the second direction (direction y) is defined by the bit line spacer 156, remains between each adjoining pair of the plurality of bit line structures 160. A plurality of insulating patterns filling the space between each adjoining pair of the plurality of bit line structures 160 and defining a contact hole CH are formed. The plurality of insulating patterns denote insulating patterns 165 formed to fill the space between the plurality of bit line structures BLS of FIG. 1 excluding a portion in which the first contact plug BC is formed. The contact hole CH corresponds to a portion of the space between the plurality of bit lines structures BLS of FIG. 1, in which the first contact plug BC is formed.

The contact hole CH may extend to the plurality of active areas 110A through the space between the plurality of bit line structures 160 to expose the plurality of active areas 110A.

The contact hole CH may be filled with a conductive material to form the first contact plug BC. The conductive material may be formed of, for example, doped polysilicon. Alternatively, the conductive material may include a barrier layer covering an inner wall of the contact hole CH and a conducive layer filling the contact hole CH on the barrier layer. Here, the barrier layer may be formed as a stack of Ti/TiN, and the conductive layer may be formed of doped polysilicon, a metal, metal silicide, conductive metal nitride, or a combination thereof. A portion of the conductive material filling an upper portion of the contact hole CH is removed to form a first contact plug BC filling a lower portion of the contact hole CH and electrically connected with the active area 110A. Metal silicide, for example, may be further formed between the first contact plug BC and the active area 110A.

Then, the plurality of second contact plugs LP electrically connected with the plurality of first contact plugs BC, respectively, and arranged on the bit line structures 160 are formed. Each of the plurality of second contact plugs LP may be formed of the body portion LP1 which is a portion arranged on an upper surface of the bit line structure 160, and the extension portion LP2 which extends from the body portion LP1 into the contact hole CH to cover the first contact plug BC. The body portion LP1 of the second contact plug LP may have the diamond-shaped cross-sectional plane, as illustrated in FIG. 1. Edges of the body portion LP1 of the second contact plug LP may be partially removed in a manufacturing process so that the cross-sectional plane of the body portion LP1 may have a round-edged diamond shape, as illustrated in FIG. 1.

In some embodiments, a metal silicide layer may be arranged between the first contact plug BC and the second contact plug LP.

The second contact plug LP may be formed of a conductive barrier layer 212A covering the bit line structure 160 and the first contact plug BC, and a plug conductive layer 214A covering the conductive barrier layer 212A. The conductive barrier layer 212A may be formed as, for example, a stack of Ti/TiN. The plug conductive layer 214A may be formed of, for example, doped polysilicon, a metal, metal silicide, conductive metal nitride, or a combination thereof.

That is, the second contact plug LP may be formed of the conductive barrier layer 212A and the plug conductive layer 214A. Also, the second contact plug LP may be formed of the body portion LP1 and the extension portion LP2.

Each of the plurality of second contact plugs LP may be formed of the body portion LP1 arranged on an upper surface of a bit line structure 160 from among two bit line structures 160 facing each other in the contact hole CH, and the extension portion LP2 extending from the body portion LP1 into the contact hole CH to cover the bit line spacer layer 156 of the bit line structure 160 from among two bit line structures 160 facing each other in the contact hole CH.

The extension portion LP2 may fill an upper portion of the contact hole CH, which is not filled with the contact plug BC. The extension portion LP2 may extend from an uppermost portion of a bit line spacer layer 156 from among two bit line spacer layers 156 facing each other downward into the contact hole CH to the first contact plug BC. The extension portion LP2 may extend through the first contact plug BC to a location which is lower than an uppermost portion of the other bit line spacer layer 156 from among the two bit line spacer layers 156. Thus, two adjacent second contact plugs LP may be separated from each other, and may be electrically connected with different first contact plugs BC. That is, the two adjacent second contact plugs LP may be separated from each other by a spacing formed by the portion of the contact hole CH, which is not filled with the extension portion LP2.

A plurality of capacitor lower electrodes 400 may be formed on the plurality of second contact plugs LP. The plurality of capacitor lower electrodes 400 may be arranged to have a hexagonal array structure like the storage nodes ST illustrated in FIG. 1. An area of a lower surface of each of the plurality of capacitor lower electrodes 400 may be greater than an area of an upper surface of the second contact plug LP. The capacitor lower electrodes 400 may be electrically connected with the active areas 110A through the second contact plug LP and the first contact plug BC.

Although it is illustrated in FIG. 2 that a capacitor lower electrode 400 has a cylinder shape, it is not limited thereto. The capacitor lower electrode 400 may adopt all of various known shapes of lower electrodes, such as a pillar shape. A capacitor dielectric layer and a capacitor upper electrode may be sequentially formed on the capacitor lower electrode 400 to form a capacitor.

FIGS. 3 through 14 are layouts and cross-sectional views for describing methods of manufacturing semiconductor devices, according to some embodiments.

Figure 3:
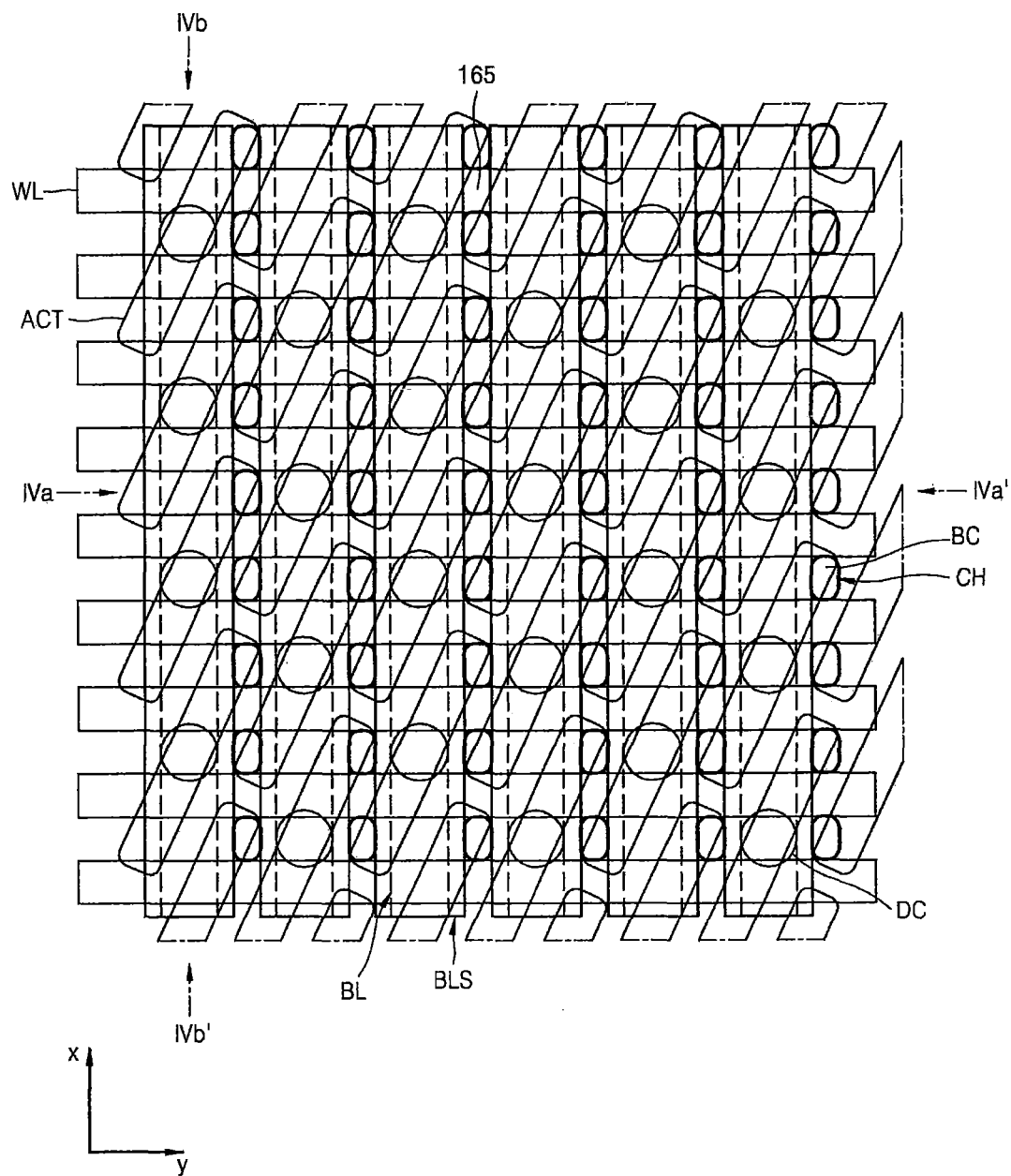
FIG. 3 is a layout illustrating a state in which a first contact plug is formed in methods of manufacturing semiconductor devices, according to some embodiments.

FIG. 3 is a layout of a state in which the first contact plug BC can be formed, in methods of manufacturing semiconductor devices in some embodiments.

Figure 4A:
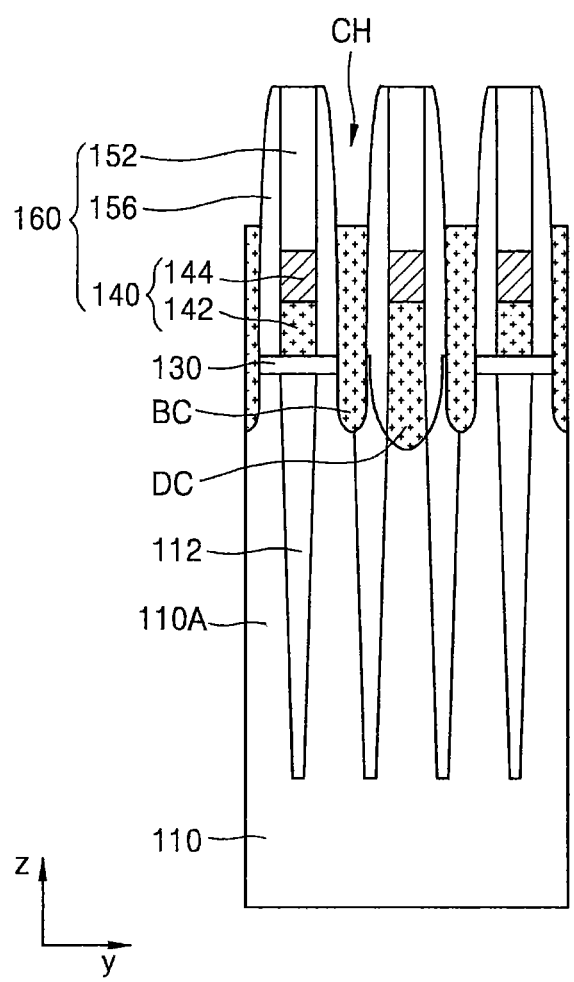
FIGS. 4A and 4B are cross-sectional views of some elements in a state in which a first contact plug is formed in methods of manufacturing semiconductor devices, according to some embodiments.
Figure 4B:
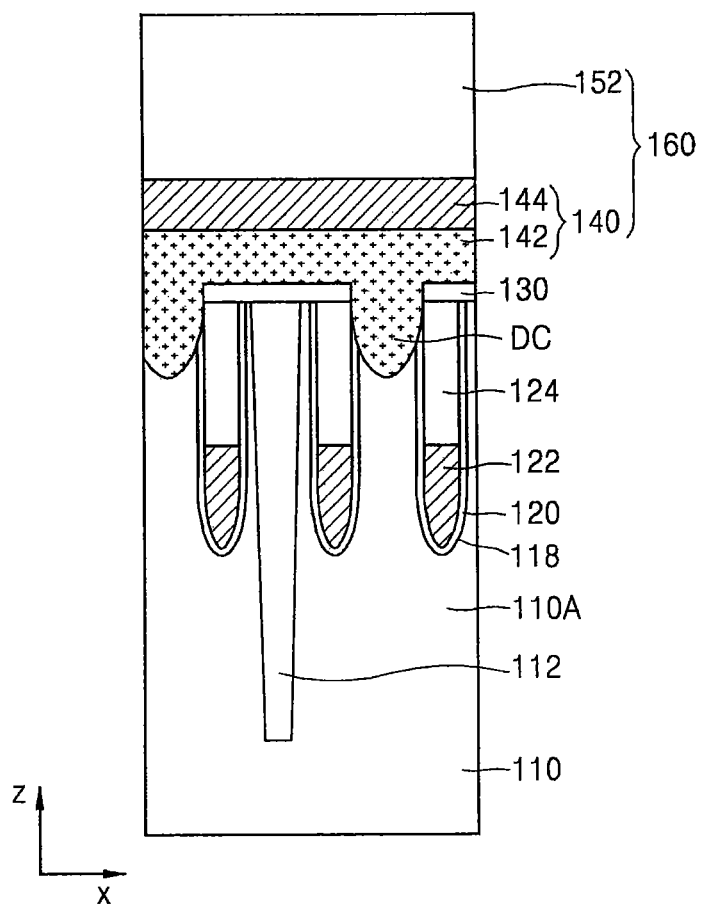

FIGS. 4A and 4B are cross-sectional views of some elements in the state in which the first contact plug BC is formed in methods of manufacturing the semiconductor device in some embodiments, taken along a line IVa-IVa' and a line IVb-IVb' of FIG. 3, respectively.

Referring to FIGS. 3 and 4B, the device separating layers 112 are formed on the substrate 110, and the plurality of active areas 110A are defined on the substrate 110 by the device separating layers 112.

A plurality of word line trenches 118 are formed on the substrate 110. The plurality of word line trenches 118 extend in parallel with one another. Each of the plurality of word line trenches 118 may have a line shape crossing the plurality of active areas 110A.

After the plurality of word line trenches 118 are cleared, a plurality of gate dielectric layers 120, a plurality of word lines 122, and a plurality of buried insulating layers 124 are sequentially formed in the plurality of word line trenches 118.

The plurality of word lines 122 may extend in parallel with one another along the second direction (direction y of FIG. 3), as the word lines WL illustrated in FIG. 3.

In some embodiments, after the plurality of word lines 122 are formed, impurity ions may be injected onto the substrate 110 at two sides of the plurality of word lines 122 to form a source/drain region in some upper portions of the plurality of active areas 110A. In some embodiments, the injection of impurity ions for forming the source/drain region may be performed before the plurality of word lines 122 are formed.

An upper surface of each of the plurality of word lines 122 is located at a level lower than a level of an upper surface of the substrate 110 (i.e., buried). A lower surface of each of the plurality of word lines 122 may have a convex-concave shape, and a saddle FinFET may be formed in the plurality of active areas 110A. In some embodiments, the plurality of word lines 122 are formed of at least one material selected from Ti, TiN, Ta, TaN, W, WN, TiSiN, and WSiN.

The gate dielectric layer 120 may be formed of at least one selected from a silicon oxide layer, a silicon nitride layer, a silicon oxynitride layer, oxide/nitride/oxide (ONO), and a high-k dielectric film having a higher dielectric constant than a silicon oxide layer. For example, the gate dielectric layer 120 may have a dielectric constant of about 10 to about 25. In some embodiments, the gate dielectric layer 120 may be formed of at least one material selected from HfO, HfSiO, HfON, HfSiON, LaO, LaAlO, ZrO, ZrSiO, ZrON, ZrSiON, TaO, TiO, BaSrTiO, BaTiO, SrTiO, YO, AlO, and PbScTaO. For example, the gate dielectric layer 120 may be formed of $HfO_2$, $Al_2O_3$, $HfAlO_3$, $Ta_2O_3$, or $TiO_2$.

An upper surface of the plurality of buried insulating layers 124 may be located at a level approximately the same as the level of the upper surface of the substrate 110. The buried insulating layer 124 may be formed of a silicon oxide layer, a silicon nitride layer, a silicon oxynitride layer, or a combination thereof.

After the plurality of word lines 122 and the plurality of buried insulating layers 124 are formed, the insulating layer pattern 130 in which the plurality of openings are formed may be formed on the substrate 110. The insulating layer pattern 130 may be formed to have a thickness of about 200 Å to about 400 Å. The insulating layer pattern 130 may include silicon oxide. For example, the insulating layer pattern 130 may be formed of tetraethylorthosilicate (TEOS), high density plasma (HDP), or boro-phospho silicate glass (BPSG).

The plurality of direct contacts DC, which may be electrically connected with the plurality of active areas 110A, are formed by filling the plurality of openings formed in the insulating layer pattern 130 with a conductive material. In the process of forming the insulating layer pattern 130 in which the plurality of openings are formed, a portion of the substrate 110, which is exposed through the plurality of openings, may be also removed, and the plurality of direct contacts DC may extend into the substrate 110 in the openings. A portion of the active area 110A, which contacts the direct contact DC, may be a source region.

The plurality of bit line structures 160 extending in parallel with one another are formed on the insulating layer pattern 130 and the plurality of direct contacts DC. The bit line structure 160 includes the bit line 140, the insulating capping layer 152 covering an upper surface of the bit line 140, and the bit line spacer layer 156 covering side walls of the bit line 140 and the insulating capping layer 152. The plurality of bit lines 140 may be electrically connected with the plurality of direct contacts DC.

In some embodiments, the bit line 140 may include at least one material selected from a semiconductor doped with impurities, a metal, conductive metal nitride, and metal silicide. In some embodiments, the bit line 140 may be formed as a stack of the first conductive layer 142 and the second conductive layer 144. The first conductive layer 142 may be formed of, for example, doped polysilicon. The second conductive layer 144 may be formed of, for example, a metal or metal nitride, such as W or TiN. Metal silicide, for example, may be further formed between the first conductive layer 142 and the second conductive layer 144.

The plurality of direct contacts DC may be formed together with the first conductive layer 142 and may be integral with the first conductive layer 142 (which can provide a unitary structure). For example, the plurality of direct contacts DC may be the conductive material with which the plurality of openings are filled to form the first conductive layer 142. In some embodiments, the plurality of direct contacts DC and the first conductive layer 142 may be formed separately. For example, the first conductive layer 142 may be formed separately after the plurality of direct contacts DC are formed.

The insulating capping layer 152 may be formed of, for example, a silicon nitride layer. The insulating capping layer 152 may be thicker than the bit line 140.

The bit line spacer layer 156 may be formed of, for example, a silicon oxide layer, a silicon nitride layer, air, or a combination thereof. In FIG. 4A, it is illustrated that the bit line spacer layer 156 is formed as a single layer. However, the present inventive concept is not limited thereto, and the bit line spacer layer 156 may be formed as a double layer, a triple layer or more.

In some embodiments, first, a conductive layer for forming a bit line, and an insulating layer covering the conductive layer for forming a bit line are formed on the insulating layer pattern 130, in order to form the plurality of bit line structures 160. The insulating layer may be thicker than the conductive layer for forming a bit line. After the plurality of capping layers 152 are formed by patterning the insulating layer, the conductive layer for forming a bit line is etched by using the plurality of insulating capping layers 152 as an etch mask, in order to form the plurality of bit lines 140. The plurality of bit lines 140 may extend in parallel with one another along the first direction (direction x of FIG. 3), as the bit lines BL illustrated in FIG. 3.

Next, the plurality of bit line spacer layers 156 covering the side walls of the plurality of bit lines 140 and the plurality of insulating capping layers 152 are formed to form the plurality of bit line structures 160.

The plurality of insulating patterns 165 defining the contact hole CH are formed in spaces between the plurality of bit line structures 160. In some exemplary embodiments, the plurality of insulating patterns 165 may be formed of a nitride layer, an oxide layer, or a combination thereof. In some exemplary embodiments, in order to form the plurality of insulating patterns 165, first an insulating layer filling the spaces between the plurality of bit line structures 160 is formed, and the insulating layer is etched back by an etchback or a chemical mechanical polishing (CMP) process to expose an upper surface of the plurality of bit line structures 160 so that portions of the insulating layer remain in the spaces between the plurality of bit line structures 160. Then, a mask pattern of a predetermined shape is formed, and a portion of the insulating layer is removed by using the mask pattern as an etch mask, in order to form the plurality of insulating patterns 165 defining the plurality of contact holes CH. Then, the mask pattern is removed.

After the plurality of insulating patterns 165 are formed, a portion of the substrate 110 is etched through lower surfaces of the plurality of contact holes CH to expose the substrate 110 at the lower surfaces of the plurality of contact holes CH. In some embodiments, when a material layer formed together with the bit line spacer layer 156 and/or the insulating layer pattern 130 remain at the lower surfaces of the plurality of contact holes CH after the plurality of insulating patterns 156 are formed, a portion of the material and/or the insulating layer pattern 130 may be etched through the lower surfaces of the plurality of contact holes CH, and then, the portion of the substrate 110 may be etched.

In some embodiments, a metal silicide layer may be formed on the surface of the substrate 110, which is exposed through the lower surfaces of the plurality of contact holes CH. For example, the metal silicide layer may be formed of cobalt silicide. However, according to the present inventive concept, the metal silicide layer is not limited thereto, and may be formed of a material selected from various types of metal silicide.

Then, a conductive layer for forming a contact, which fills the plurality of contact holes CH and covers the plurality of bit line structures 160, is formed. In some embodiments, the conductive layer for forming a contact may be formed of doped polysilicon. In some embodiments, the conductive layer for forming a contact may include a barrier layer covering inner walls of the plurality of contact holes CH and a conductive layer filling the plurality of contact holes CH on the barrier layer. Here, the barrier layer may be a formed as a stack of Ti/TiN, and the conductive layer may be formed of doped polysilicon, a metal, metal silicide, conductive metal nitride, or a combination thereof.

An upper surface of the bit line structure 160 is exposed by removing a portion of the conductive layer for forming a contact, and the first contact plug BC is formed by forming a space in an upper portion of the contact hole CH.

The plurality of first contact plugs BC may extend in a vertical direction in the plurality of contact holes CH, that is, in a direction which is perpendicular (direction z) to a main surface of the substrate 110, and may have an upper surface which is lower than the upper surface of the bit line structure 160. That is, the plurality of first contact plugs BC may fill some lower portions of the plurality of contact holes CH. The first contact plug BC may have a horizontal cross-sectional area of a first size, which is defined by a size of the contact hole CH.

The method of manufacturing the device separating layer 112, the active areas 110A, the word line trenches 118, the gate dielectric layers 120, the word lines 122, the buried insulating layers 124, the insulating layer patterns 130, the direct contacts DC, the bit line structures 160, the insulating patterns 165, the contact holes CH, and the first contact plugs BC is described with reference to FIGS. 3 through 4B. However, the present inventive concept is not limited thereto. The method thereof may vary including manufacturing the first contact plug BC having an upper surface lower than an upper surface of the bit line structure 160.

Figure 5:
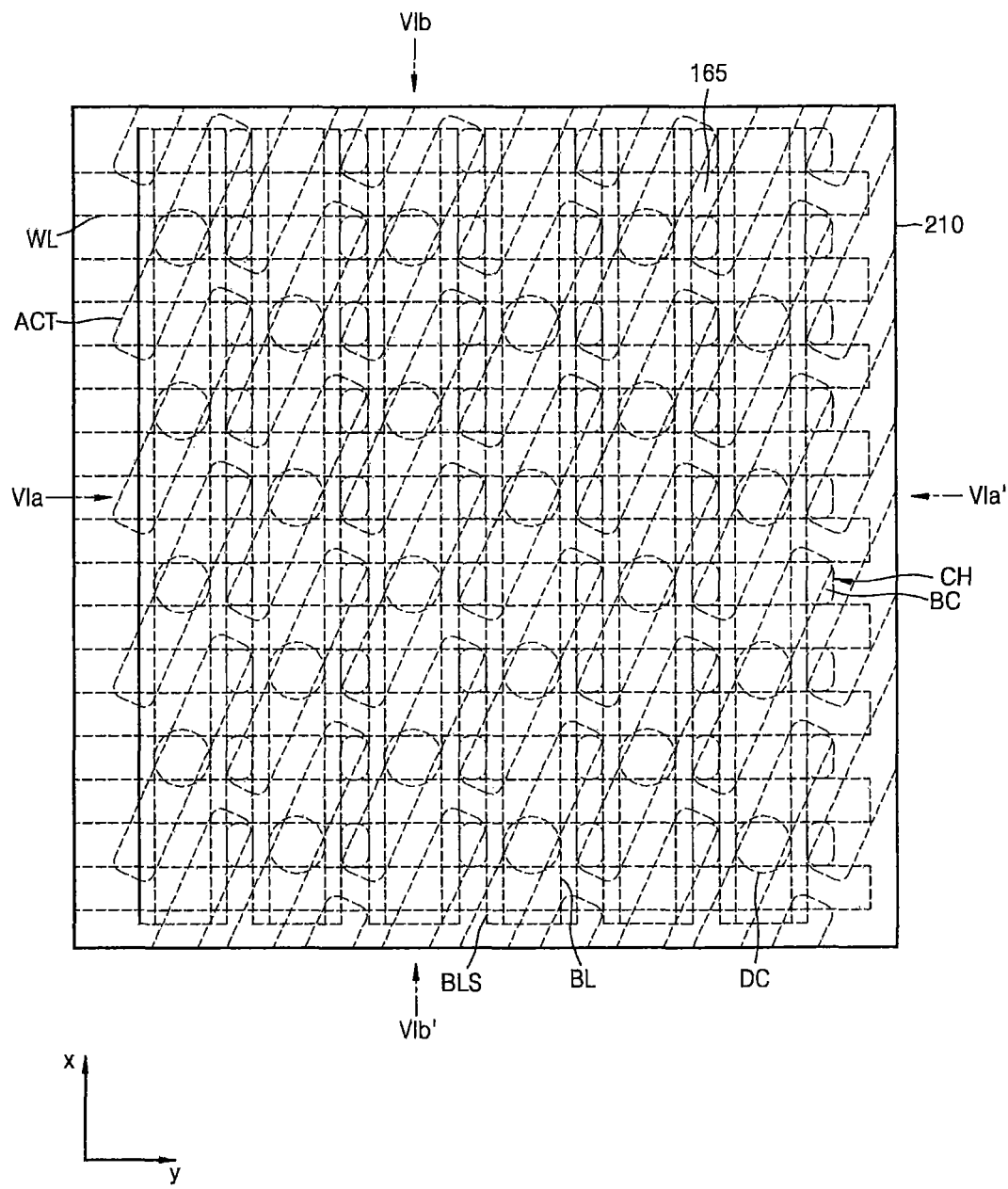
FIG. 5 is a layout illustrating a state in which a conductive material layer is formed in methods of manufacturing semiconductor devices, according to some embodiments.

FIG. 5 is a layout illustrating a state in which a conductive material layer 210 is formed in methods of manufacturing the semiconductor device in some embodiments.

Figure 6A:
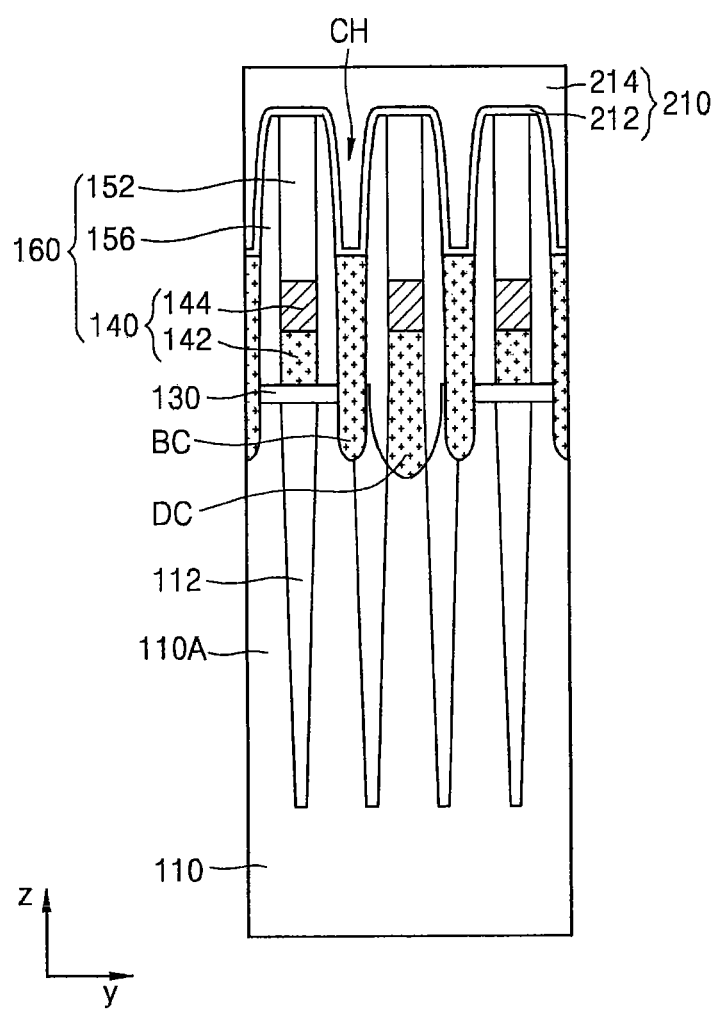
FIGS. 6A and 6B are cross-sectional views of some elements in a state in which a conductive material layer is formed in methods of manufacturing semiconductor devices, according to some embodiments.
Figure 6B:
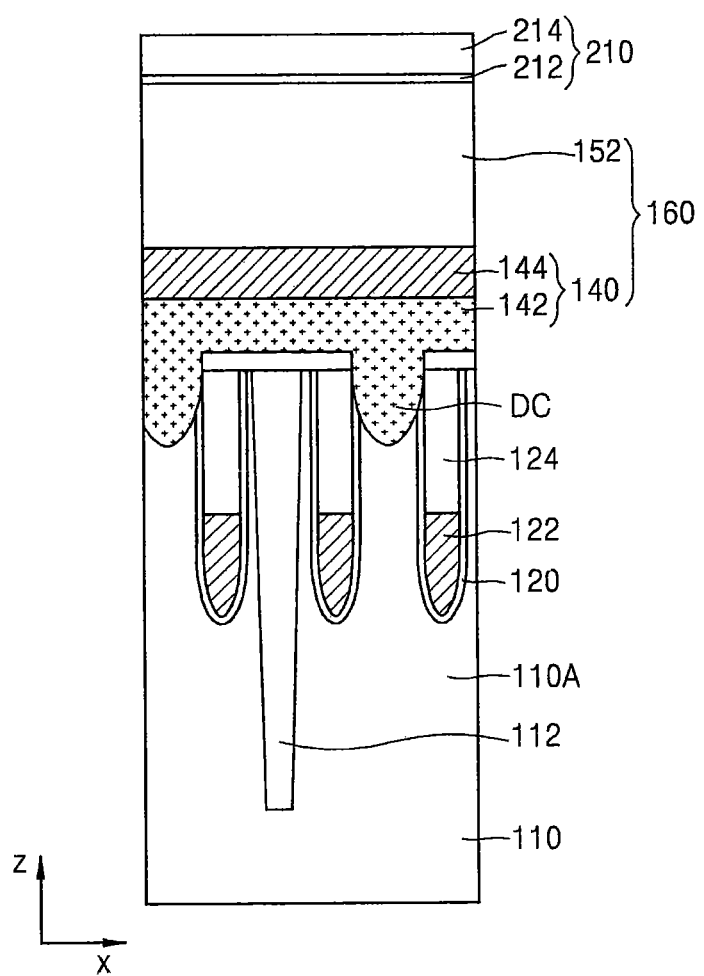

FIGS. 6A and 6B are cross-sectional views of some elements in the state in which the conductive material layer 210 is formed in methods of manufacturing the semiconductor device in some embodiments, taken along a line VIa-VIa' and a line VIb-VIb' of FIG. 5, respectively.

Referring to FIGS. 5 through 6B, the conductive material layer 210 filling the plurality of contact holes CH and covering the plurality of bit line structures 160 is formed. In some embodiments, the conductive material layer 210 may include a barrier layer 212 covering inner walls of the plurality of contact holes CH, and the plurality of bit line structures 160, and a conductive layer 214 for forming a landing plug, which fills the contact hole CH on the barrier layer 212. Here, the barrier layer 212 may be formed as a stack of Ti/TiN and the conductive layer 214 for forming a landing plug may be formed of doped polysilicon, a metal, metal silicide, conductive metal nitride, or a combination thereof. For example, the conductive layer 214 for forming a landing plug may be formed of a metal, such as W.

Figure 7A:
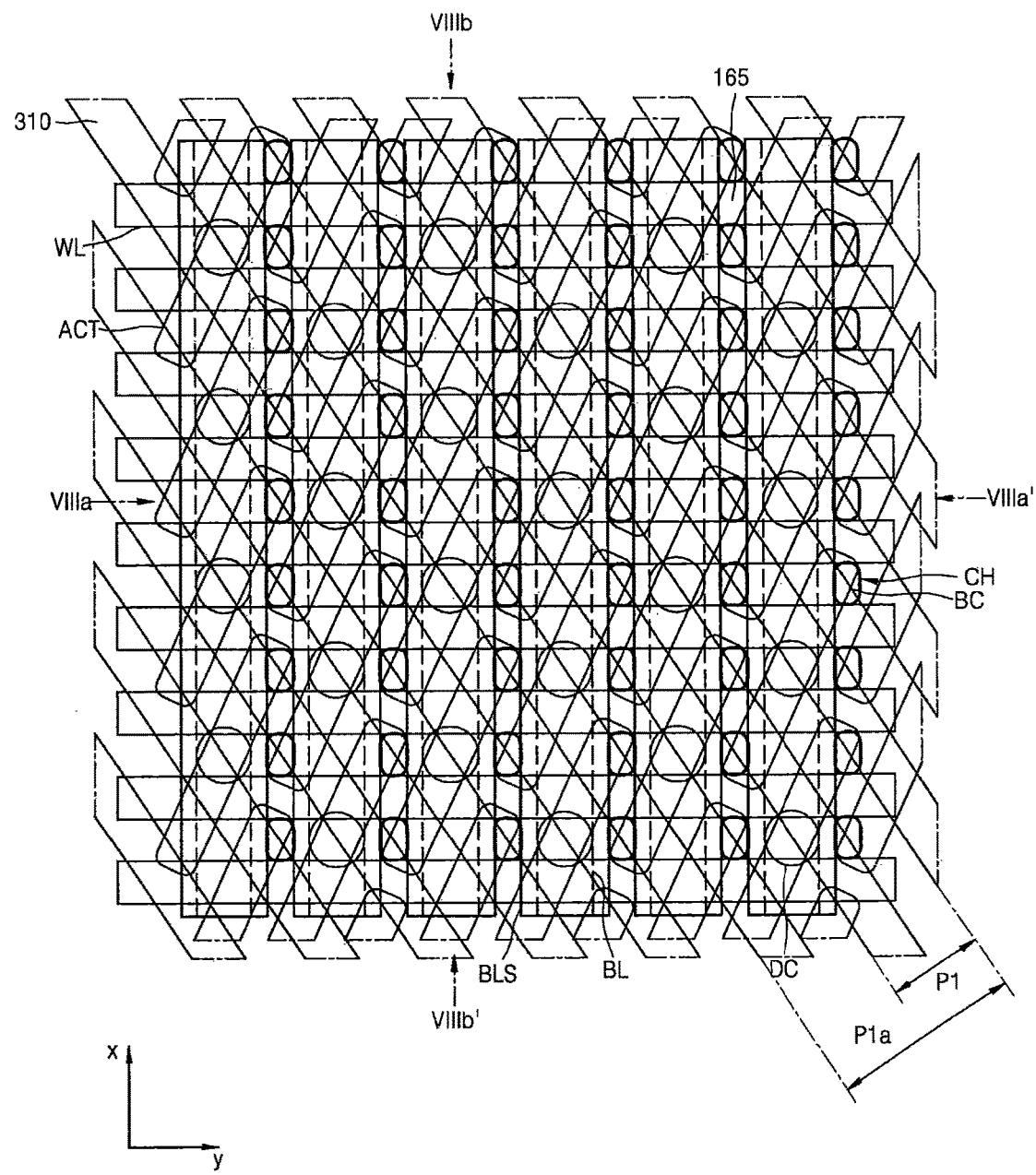
FIGS. 7A and 7B are layouts illustrating a state in which a first line pattern is formed in methods of manufacturing semiconductor devices, according to some embodiments.
Figure 7B:
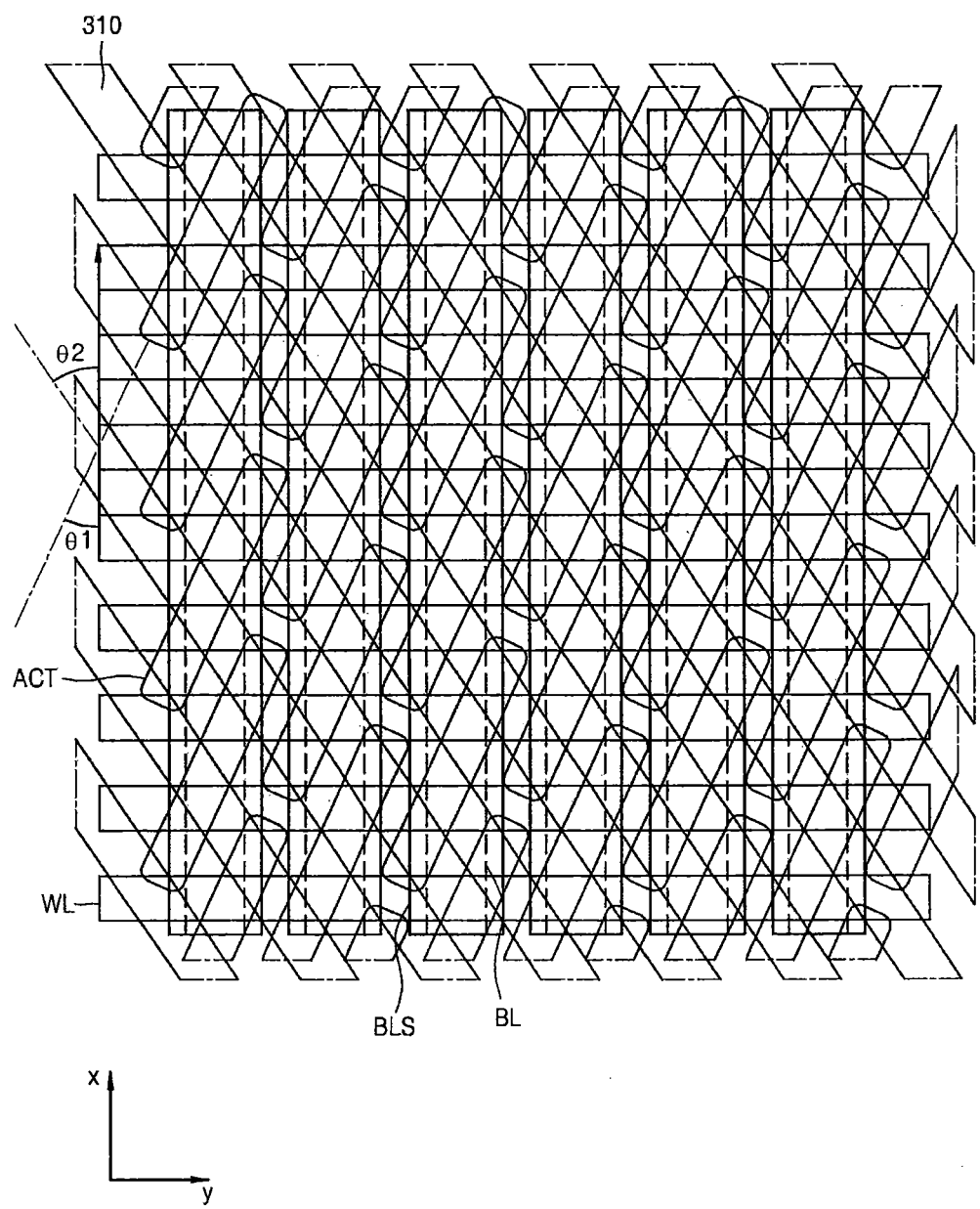

FIGS. 7A and 7B are layouts illustrating a state in which a plurality of first line patterns 310 are formed in methods of manufacturing the semiconductor device in some embodiments. In detail, FIG. 7B is a layout of FIG. 7A, in which some elements of FIG. 7A are omitted.

Figure 8A:
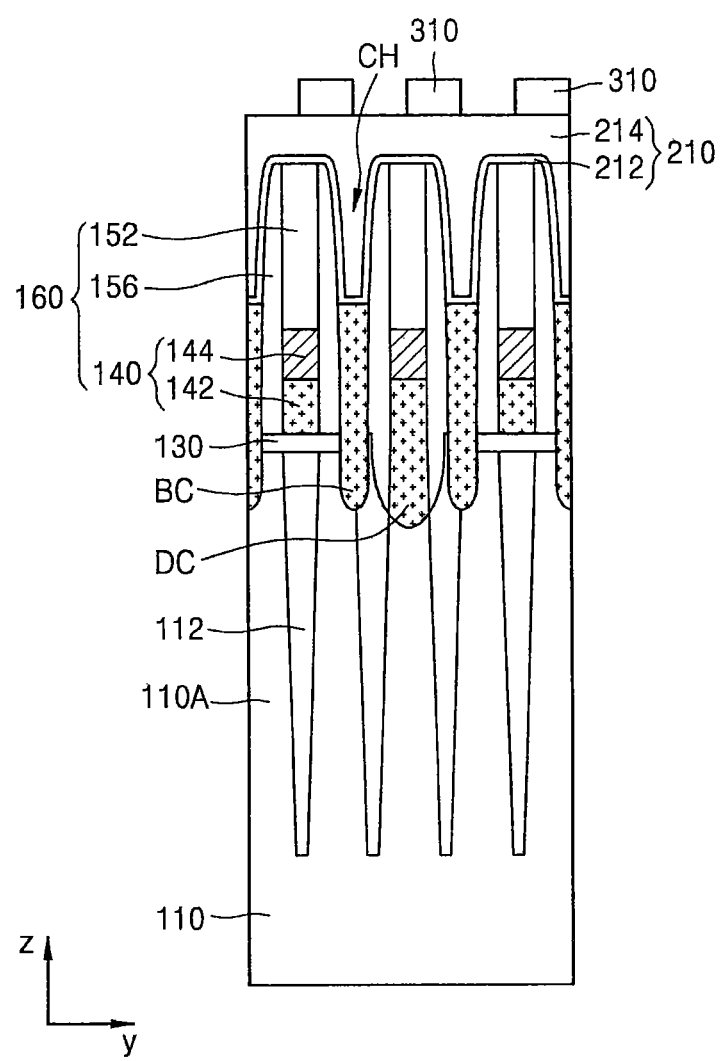
FIGS. 8A and 8B are cross-sectional views of some elements in a state in which a first line pattern is formed in methods of manufacturing semiconductor devices, according to some embodiments.
Figure 8B:
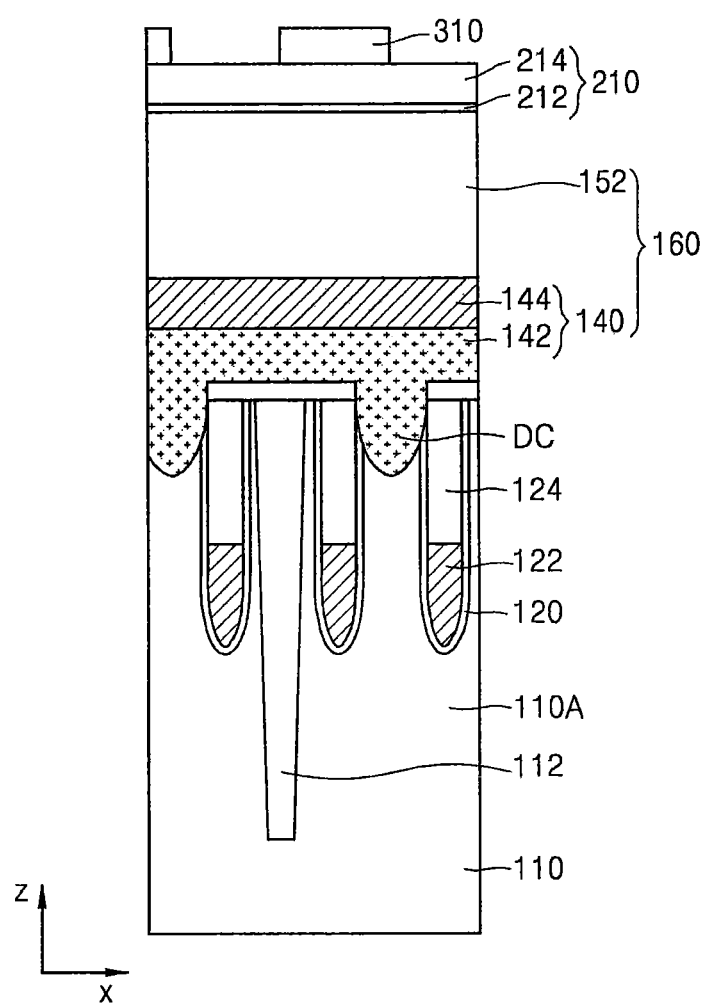

FIGS. 8A and 8B are cross-sectional views of some elements in the state in which the plurality of first line patterns 310 are formed in methods of manufacturing the semiconductor device in some embodiments, taken along a line VIIIa-VIIIa' and a line VIIIb-VIIIb' of FIG. 7A, respectively.

Referring to FIGS. 7A through 8B, the plurality of first line patterns 310 extending as a diagonal line with respect to an extension direction of the bit line structure BLS, that is, with respect to the first direction (direction x) are formed on the conductive material layer 210. The plurality of first line patterns 310 extend in parallel with one another as the diagonal line with respect to the first direction (direction x). The plurality of first line patterns 310 may be arranged at equal intervals.

The plurality of first line patterns 310 may have a first pitch P1. The plurality of first line patterns 310 may be obtained by a double patterning technology (DPT) from a mother pattern which is formed by a photolithography process such that the mother pattern has a pitch P1a which is greater than the first pitch P1.

In some embodiments, the plurality of first line patterns 310 may be formed by self aligned double patterning (SADP). In some embodiments, the plurality of first line patterns 310 may be formed by self aligned reverse patterning (SARP).

Here, the SADP denotes forming the plurality of first line patterns 310 by using (as an etch mask) a son pattern which is formed by self aligned patterning between the mother pattern formed by the photolithography process and spacers formed at a side wall of the mother pattern. The SARP denotes forming the plurality of first line patterns 310 by using (as an etch mask) the spacers formed at the side wall of the mother pattern formed by the photolithography process.

The plurality of first line patterns 310 may be formed of, for example, polysilicon, oxide, nitride, oxynitride, or a carbon-based layer. The carbon-based layer may be formed of, for example, an amorphous carbon layer (ACL) or a carbon based spin-on hardmask (C—SOH) layer. However, the present inventive concept is not limited thereto.

The plurality of first line patterns 310 may be obtained by a process using a mother pattern formed by a photolithography process to have a pitch that is twice the first pitch P1. For example, the plurality of first line patterns 310 may be obtained by the DPT, or by a quadruple pattern technology (QPT), from a mother pattern which is formed by a photolithography process to have a pitch that is four times the first pitch P1.

Referring to FIG. 7B, each of the plurality of active areas ACT may have a major axis extending along a direction which is diagonal with respect to the first direction (direction x). The major axis of the active area ACT may have a first angle θ1 with respect to the first direction (direction x). Here, the first angle θ1 denotes an acute angle formed by the major axis of the active area ACT and the first direction (direction x).

Each of the plurality of first line patterns 310 may extend by a second angle θ2 with respect to the first direction (direction x). Here, the second angle θ2 denotes an acute angle formed by the extension direction of the first line patterns 310 and the first direction (direction x).

The plurality of first line patterns 310 may extend in the diagonal direction with respect to the first direction (direction x) such that the second angle θ2 is greater than the first angle θ1. That is, the first angle θ1 is greater than 0° and less than the second angle θ2.

Figure 9A:
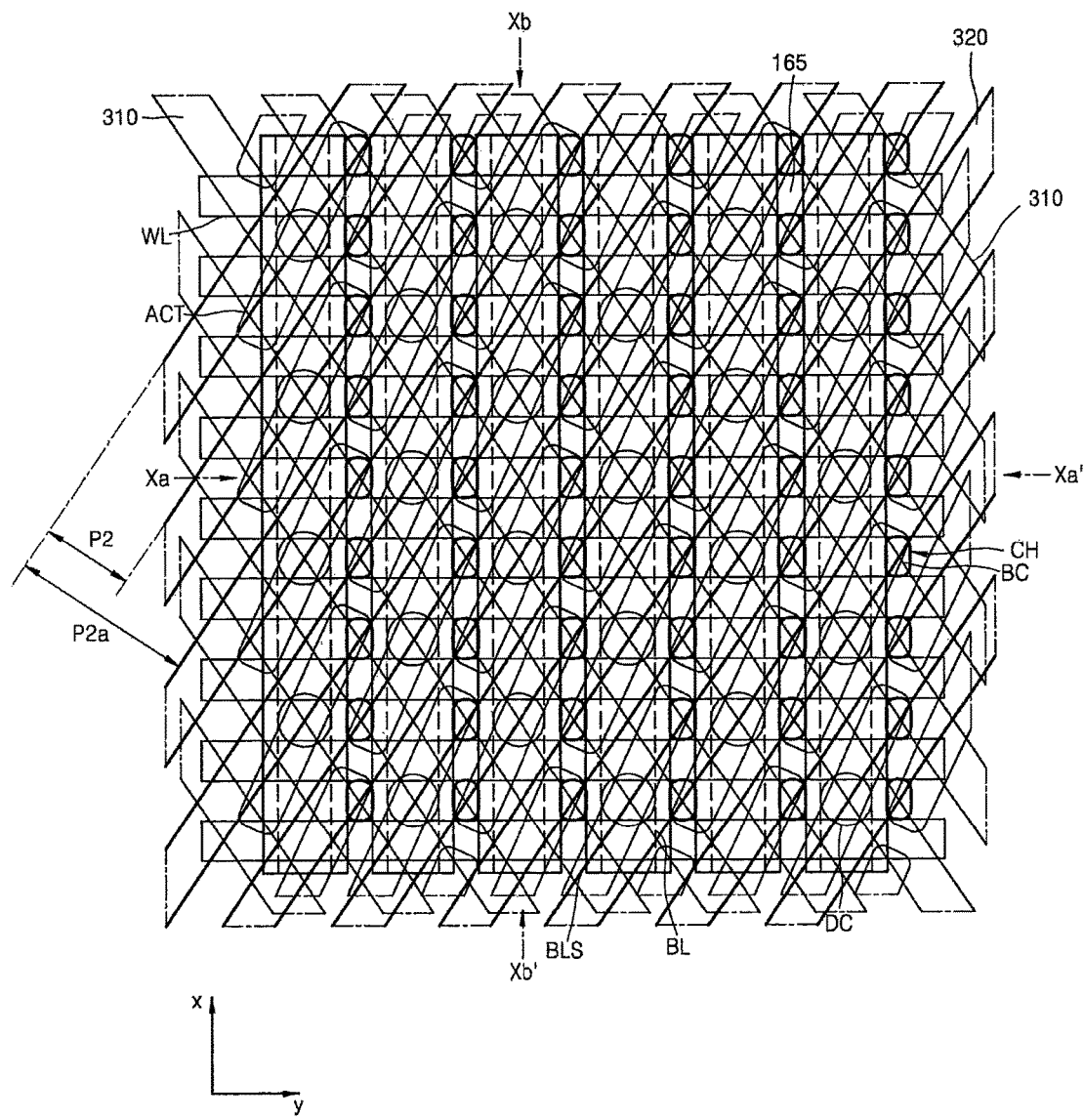
FIGS. 9A through 9C are layouts illustrating a state in which a second line pattern is formed in methods of manufacturing semiconductor devices, according to some embodiments.
Figure 9B:
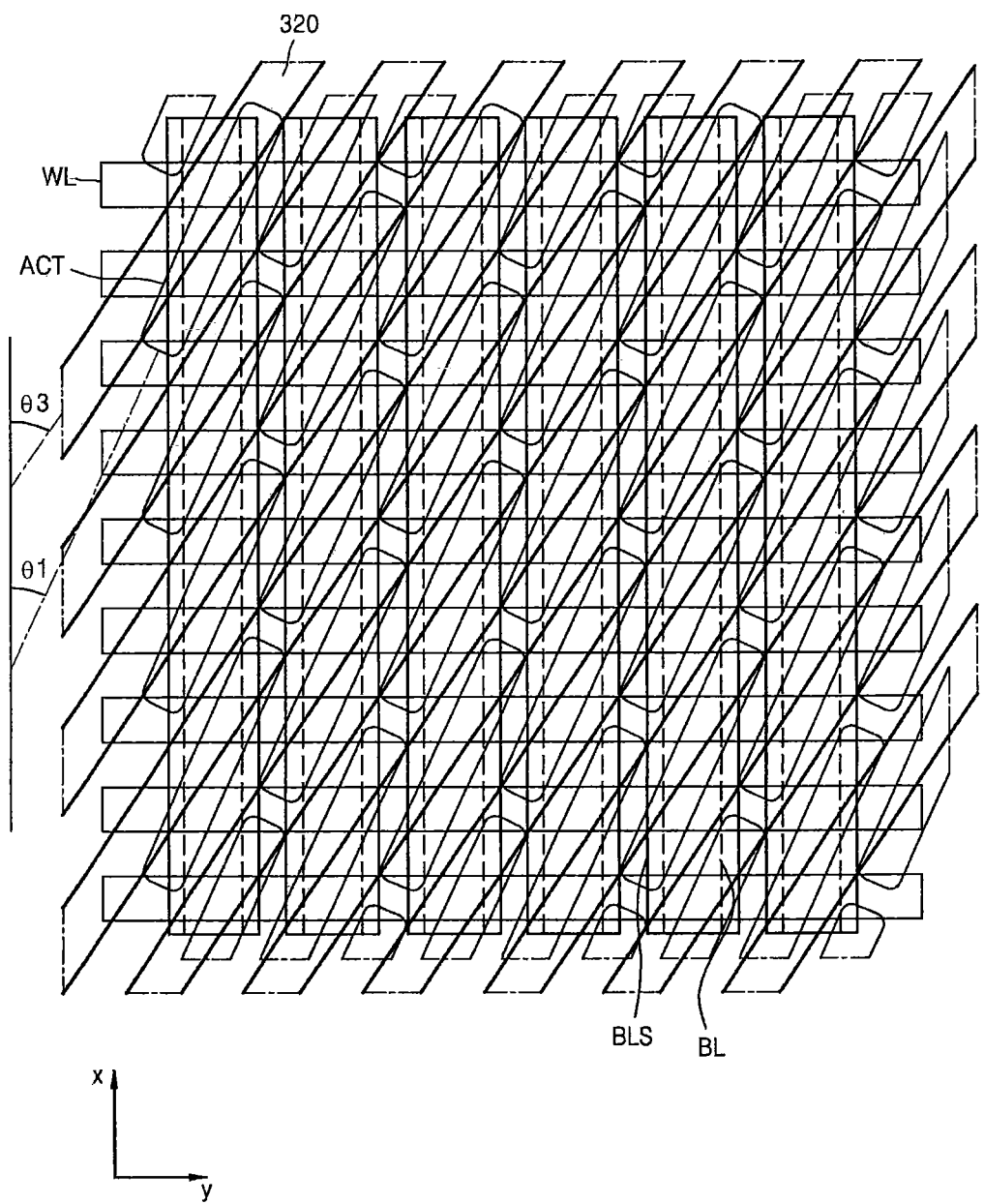
Figure 9C:
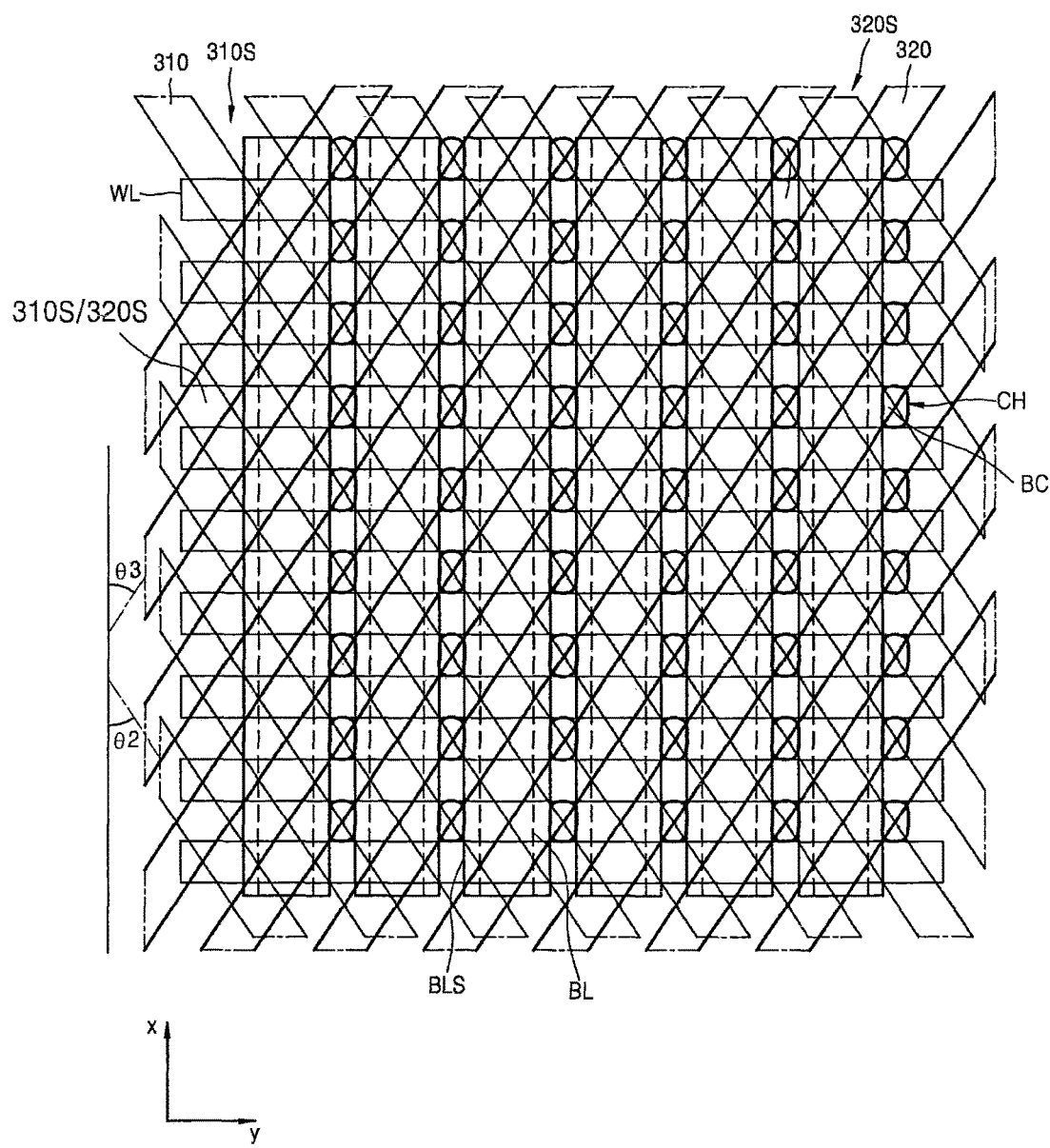

FIGS. 9A through 9C are layouts illustrating a state in which a plurality of second line patterns 320 are formed in methods of manufacturing semiconductor devices according to some embodiments. In detail, FIGS. 9B and 9C are layouts of FIG. 9A, in which some elements of FIG. 9A are omitted.

Figure 10A:
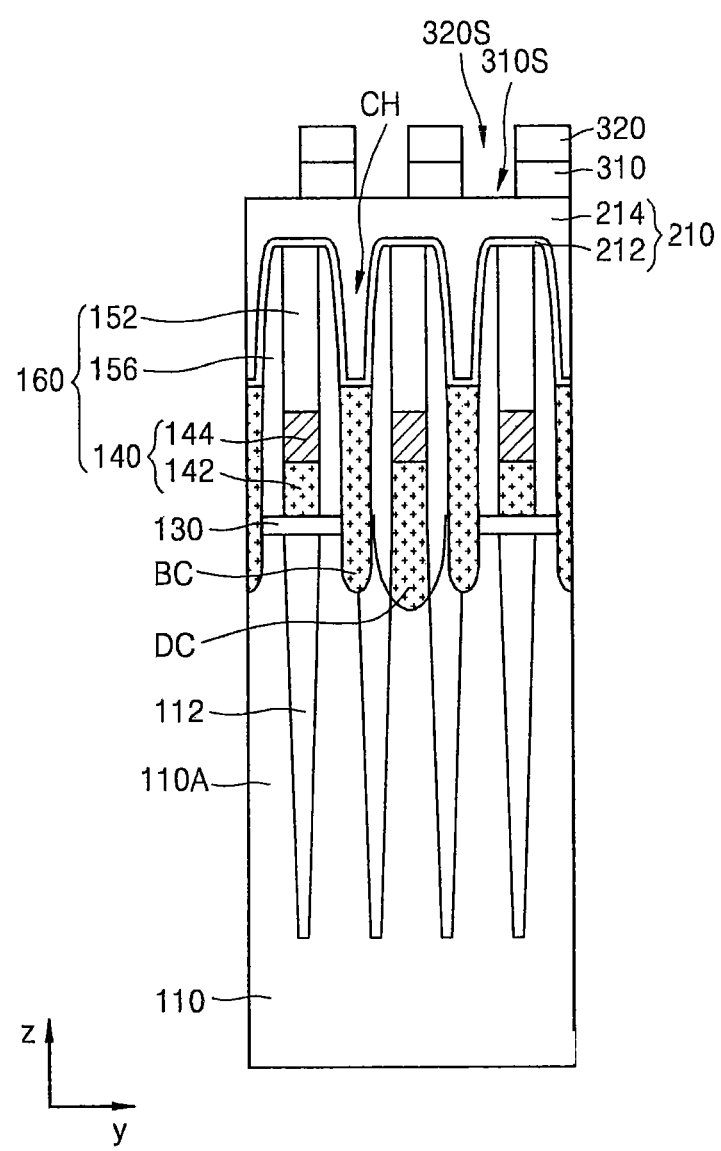
FIGS. 10A and 10B are cross-sectional views of some elements in a state in which a second line pattern is formed in methods of manufacturing semiconductor devices, according to some embodiments.
Figure 10B:
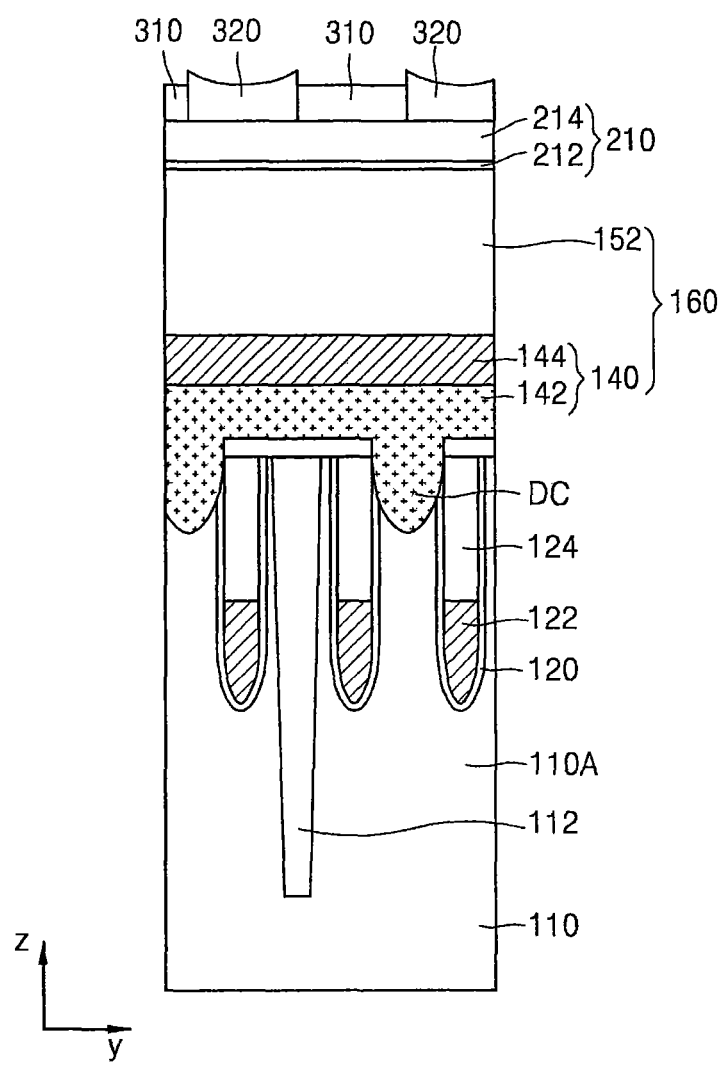

FIGS. 10A and 10B are cross-sectional views of some elements in the state in which the plurality of second line patterns 320 are formed in methods of manufacturing semiconductor devices according to some embodiments. FIGS. 10A and 10B are cross-sectional views taken along a line Xa-Xa' and a line Xb-Xb' of FIG. 9A, respectively.

Referring to FIGS. 9A through 10B, the plurality of second line patterns 320 extending by forming a diagonal line with respect to the extension direction of the bit line structure BLS, that is, with respect to the first direction (direction x), and crossing the plurality of first line patterns 310, are formed on the conductive material layer 210 on which the plurality of first line patterns 310 are formed. The plurality of second line patterns 320 extend in parallel with one another by forming the diagonal line with respect to the first direction (direction x). The plurality of second line patterns 320 may be arranged at equal intervals.

The plurality of second line patterns 320 may have a second pitch P2. The plurality of second line patterns 320 may be obtained by a double patterning technology (DPT) from a mother pattern which is formed by a photolithography process to have a pitch P2a which is greater than the second pitch P2.

In some embodiments, the plurality of second line patterns 320 may be formed by self aligned double patterning (SADP). In some embodiments, the plurality of second line patterns 320 may be formed by self aligned reverse patterning (SARP). The plurality of second line patterns 320 may be formed of, for example, polysilicon, oxide, nitride, oxynitride, or a carbon-based layer. However, the present inventive concept is not limited thereto.

The plurality of second line patterns 320 may be obtained by a process using a mother pattern formed by a photolithography process to have a pitch that is twice the second pitch P2. For example, the plurality of first line patterns 310 may be obtained by the DPT, or by a quadruple pattern technology (QPT), from a mother pattern which is formed by a photolithography process to have a pitch that is four times the second pitch P1.

Referring to FIG. 9B, the major axis of the active area ACT may have the first angle θ1 with respect to the first direction (direction x). Each of the plurality of second line patterns 320 may extend by a third angle θ3 with respect to the first direction (direction x). Here, the third angle θ3 denotes an acute angle formed by the extension direction of the plurality of second line patterns 320 and the first direction (direction x).

The plurality of second line patterns 320 may extend in the diagonal direction with respect to the first direction (direction x) such that the third angle θ3 is greater than the first angle θ1. That is, the first angle θ1 may be greater than 0° and less than the third angle θ3.

Referring to FIG. 9C, the plurality of first line patterns 310 and the plurality of second line patterns 320 may cross each other. The plurality of first line patterns 310 and the plurality of second line patterns 320 may form diagonal lines extending by the same angle with respect to the first direction (direction x). That is, the plurality of first line patterns 310 and the plurality of second line patterns 320 may extend by the second angle θ2 and the third angle θ3, respectively, with respect to the first direction (direction x). Here, the second angle θ2 and the third angle θ3 may be the same angle.

Referring to FIGS. 9B and 9C, the first angle θ1 may be greater than 0° and less than the second angle θ2 and the third angle θ3.

Referring to FIG. 9C again, portions of the plurality of first line patterns 310, crossed by the plurality of second line patterns 320, may have a hexagonal array structure with respect to a main surface of the substrate 110 (refer to FIGS. 10A and 10B). The portions of the plurality of first line patterns 310, crossed by the plurality of second line patterns 320, may have a diamond shaped cross-sectional plane where not all interior angles in the diamond shape are equal to one another.

The plurality of first line patterns 310 and the plurality of second line patterns 320 may be formed such that the portions of the plurality of first line patterns 310, crossed by the plurality of second line patterns 320, overlap (or span) a portion of the bit line structure BLS and a portion of the contact hole CH in a direction perpendicular to the main surface of the substrate 110 (refer to FIGS. 10A and 10B).

The plurality of first line patterns 310 and the plurality of second line patterns 320 may be formed such that at least a portion of a space in which a first space 310S (which is a space among the plurality of first line patterns 310) and a second space 320S (which is a space among the plurality of second line patterns 320) cross each other overlap the first contact plug BC in the direction perpendicular to the main surface of the substrate 110 (refer to FIGS. 9C, 10A and 10B). Then, in a process of forming the second contact plug LP (refer to FIG. 1A) through the space in which the first space 310S and the second space 320S cross each other, the plurality of second contact plugs LP may be separated from one another. That is, the first contact plug BC may overlap each of the portion of the plurality of first line patterns 310, crossed by the plurality of second line patterns 320, and the portion of the space in which the first space 310S and the second space 320S cross each other, in the direction perpendicular to the main surface of the substrate 110 (refer to FIGS. 10A and 10B).

Figure 11A:
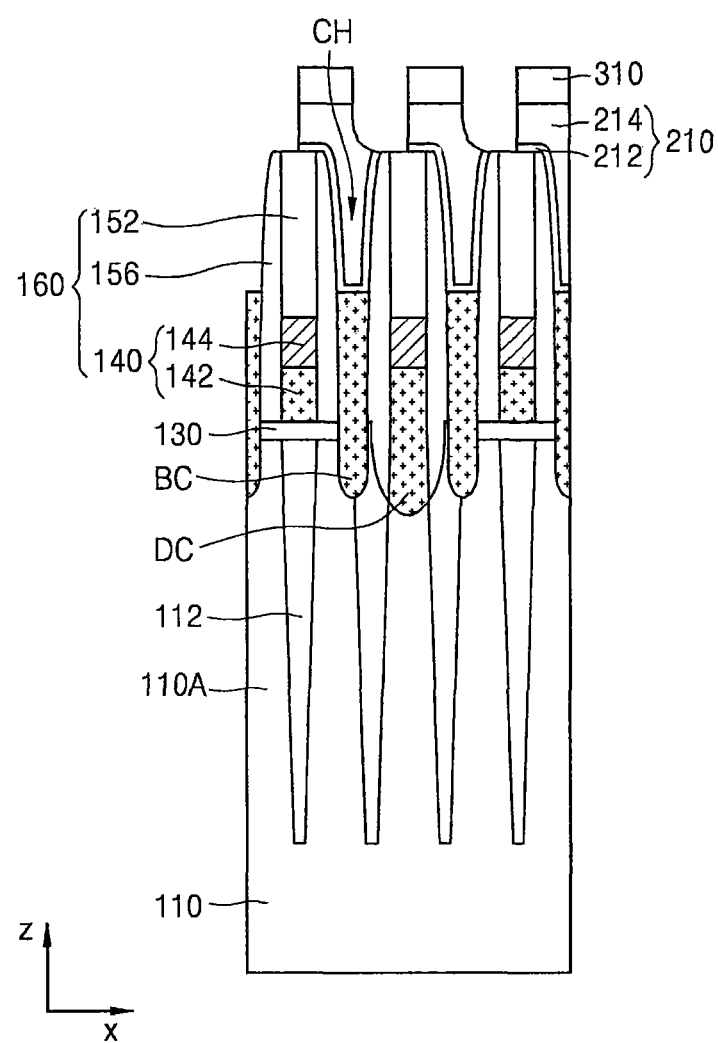
FIGS. 11A and 11B are cross-sectional views illustrating etching a conductive material layer in methods of manufacturing semiconductor devices, according to some embodiments.
Figure 11B:
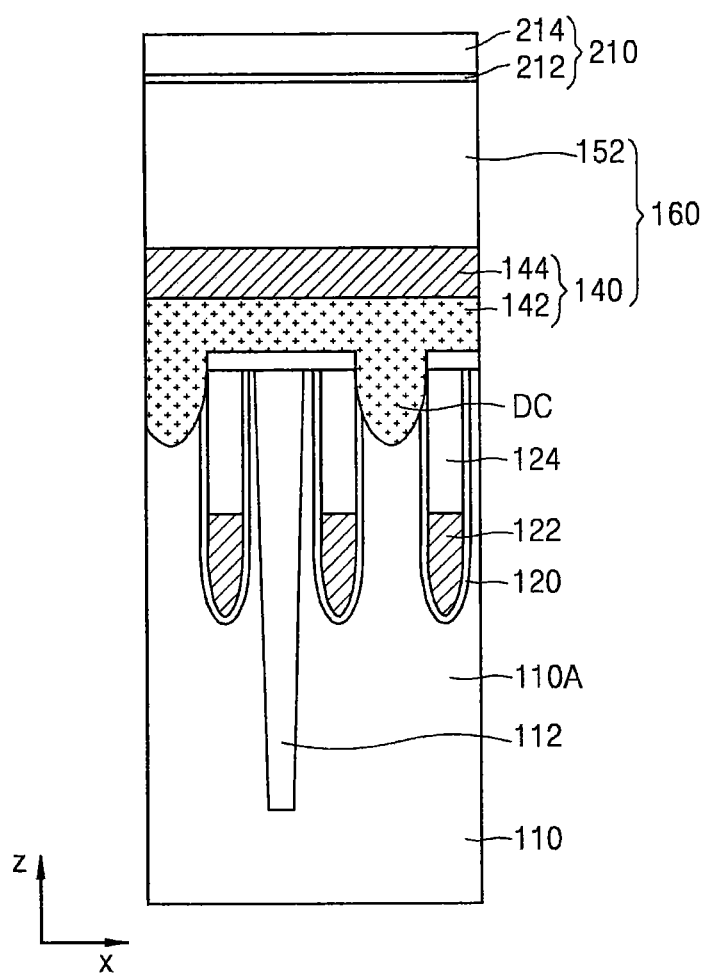

FIGS. 11A and 11B are cross-sectional views for describing a process of etching the conductive material layer 210 in methods of manufacturing semiconductor devices in some embodiments according to the invention, taken along a line Xa-Xa' and a line Xb-Xb' of FIG. 9A, respectively.

Referring to FIGS. 9A through 10B, 11A, and 11B, the conductive material layer 210 is etched by using the plurality of first line patterns 310 and the plurality of second line patterns 320 as an etch mask.

In the etching of the conductive material layer 210, exposed upper surfaces of the plurality of first line patterns 310 and the plurality of second line patterns 320 may be also removed. Here, an etching speed of the plurality of first line patterns 310 and the plurality of second line patterns 320 may be less than an etching speed of the conductive material layer 210, or a thickness of the plurality of first line patterns 310 and the plurality of second line patterns 320 may be greater than a thickness of the conductive material layer 210, so that the plurality of first line patterns 310 and the plurality of second line patterns 320 may function as the etch mask and may at least partially remain after etching.

Since the plurality of second line patterns 320 are formed on the plurality of first line patterns 310, the upper surface of the plurality of second line patterns 320 is completely exposed. Thus, in the etching and removing of the conductive material layer 210, the plurality of second line patterns 320 may be also removed. Until the plurality of second line patterns 320 are completely removed, portions of the conductive material layer 210, exposed through the space in which the first space 310S and the second space 320S cross each other, may be etched. Even if the plurality of second line patterns 320 are completely removed, the portions of the plurality of first line patterns 310, crossed by the plurality of second line patterns 320, may not be removed and may remain. Here, the other portions of the plurality of first line patterns 310, not crossed by the plurality of second line patterns 320, may be completely removed.

In this process, the portions of the conductive material layer 210 that are exposed by the plurality of first line patterns 310 and the second line patterns 320, may be removed to expose a portion of the upper surface of the bit line structure 160.

Figure 12:
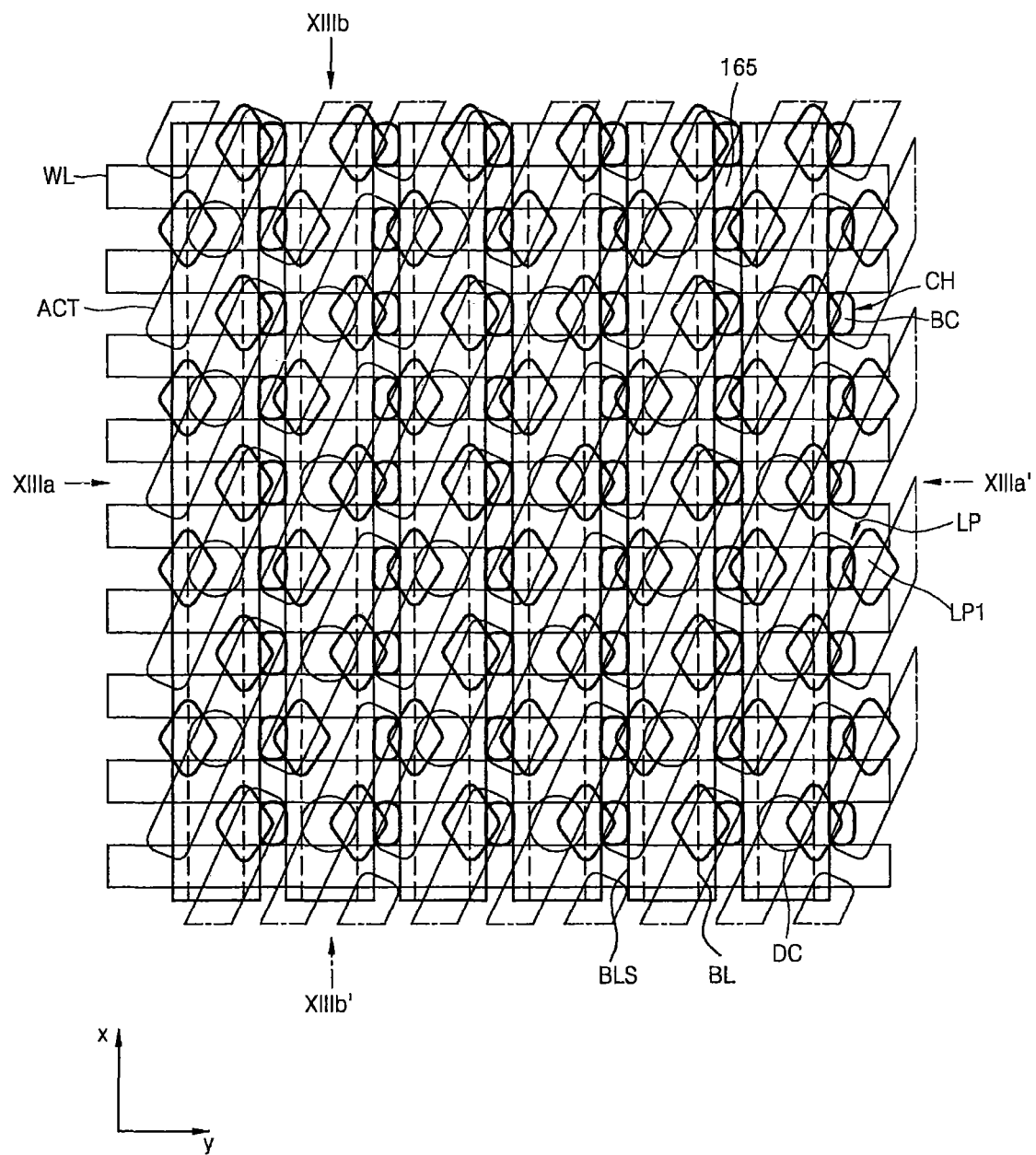
FIG. 12 is a layout illustrating a state in which a second contact plug is formed in methods of manufacturing semiconductor devices, according to some embodiments.

FIG. 12 is a layout illustrating a state in which the second contact plug LP is formed in methods of manufacturing semiconductor devices in some embodiments.

Figure 13A:
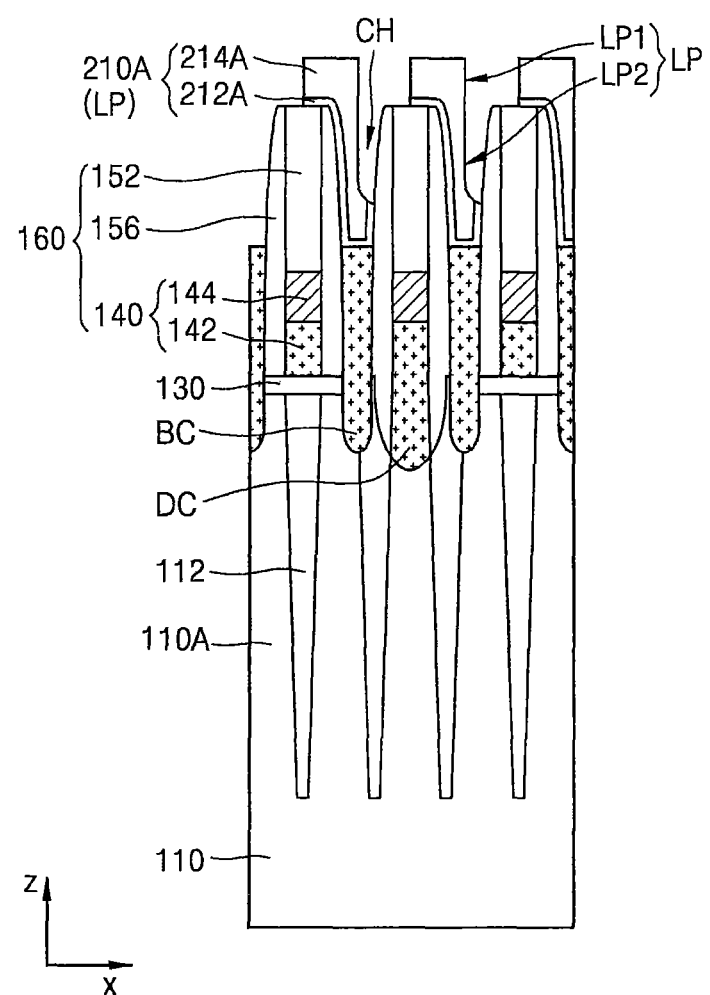
FIGS. 13A and 13B are cross-sectional views of some elements in a state in which a second contact plug is formed in methods of manufacturing semiconductor devices, according to some embodiments.
Figure 13B:
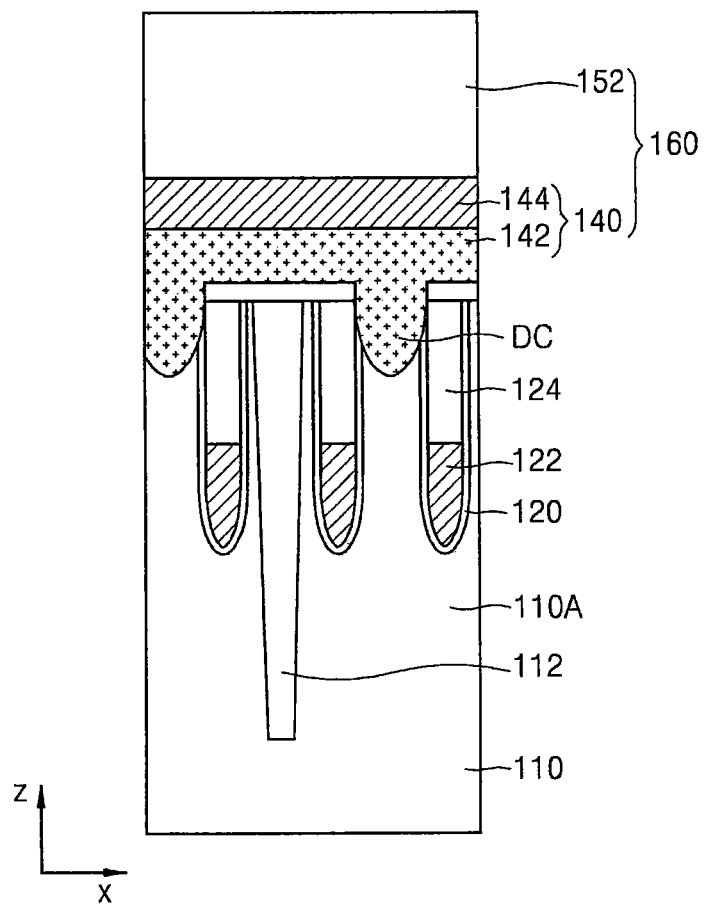

FIGS. 13A and 13B are cross-sectional views of some elements in the state in which the second contact plug LP is formed in methods of manufacturing semiconductor devices in some embodiments, taken along a line XIIIa-XIIIa' and a line XIIIb-XIIIb' of FIG. 12, respectively.

Referring to FIGS. 12 through 13B, the second contact plug LP is formed by the etching process of the conductive material layer 210 (refer to FIG. 11A). After the second contact plug LP is formed, a portion of the first line pattern 310 (refer to FIG. 11A) remaining on the second contact plug LP may be removed. The etching process of the conductive material layer 210 for forming the second contact plug LP may be performed before the first contact plug BC is exposed. Thus, the second contact plug LP may completely cover an upper surface of the first contact plug BC.

The second contact plug LP may be formed of the conductive barrier layer 212A and the plug conductive layer 214A covering the conductive barrier layer 212A. The conductive barrier layer 212A and the plug conductive layer 214A denote a remaining portion of the barrier layer 212 and a remaining portion the conductive layer 214 for forming a landing plug, illustrated in FIG. 10A, respectively, after the etching of the conductive material layer 210.

The second contact plug LP may extend from the upper surface of the bit line structure 160 downward into the contact hole CH to electrically connect with the first contact plug BC. The portion of the second contact plug LP, arranged on the upper surface of the bit line structure BLS, may be referred to as the body portion LP1, and the portion of the second contact plug LP in the contact hole CH, may be referred to as the extension portion LP2.

Since the body portion LP1 remains according to the portions that cross one another to provide the plurality of first line patterns and the plurality of second line patterns 320, the diamond-shaped cross-sectional plane may be provided for the body portion LP1 as illustrated in FIG. 9C. However, edges of the diamond shape may be partially removed during the etching process, and thus, the cross-sectional plane of the body portion LP1 of the second contact plug LP may have a round-edged diamond shape. When the edges of the diamond shape are subjected to greater etching, however, the cross-sectional plane of the body portion LP1 of the second contact plug LP may have an oval shape.

Next, the plurality of capacitor lower electrodes 400 may be formed on the plurality of second contact plugs LP, as illustrated in FIG. 2.

In the semiconductor device according to some embodiments, the plurality of second contact plugs LP are separated from one another simultaneously by the formation of the second contact plug LP. Thus, bridging between the plurality of second contact plugs LP may be prevented. Also, since the second contact plug LP completely covers the upper surface of the first contact plug BC, sufficient low contact resistance may be obtained between the first contact plug BC and the second contact plug LP. Also, since the second contact plug LP is integrally formed at once, extending from the bit line structure BLS to the first contact plug BC, necking may be prevented from occurring on the second contact plug LP.

The present inventive concept is not limited to the method of forming the second contact plug LP. For example, the etching process using the plurality of first line patterns 310 (refer to FIG. 9A) and the plurality of second line patterns 320 (refer to FIG. 9A) crossing the plurality of first line patterns 310, may also be applied in forming the plurality of storage nodes ST arranged to have the hexagonal array structure, as illustrated in FIG. 1.

Figure 14:
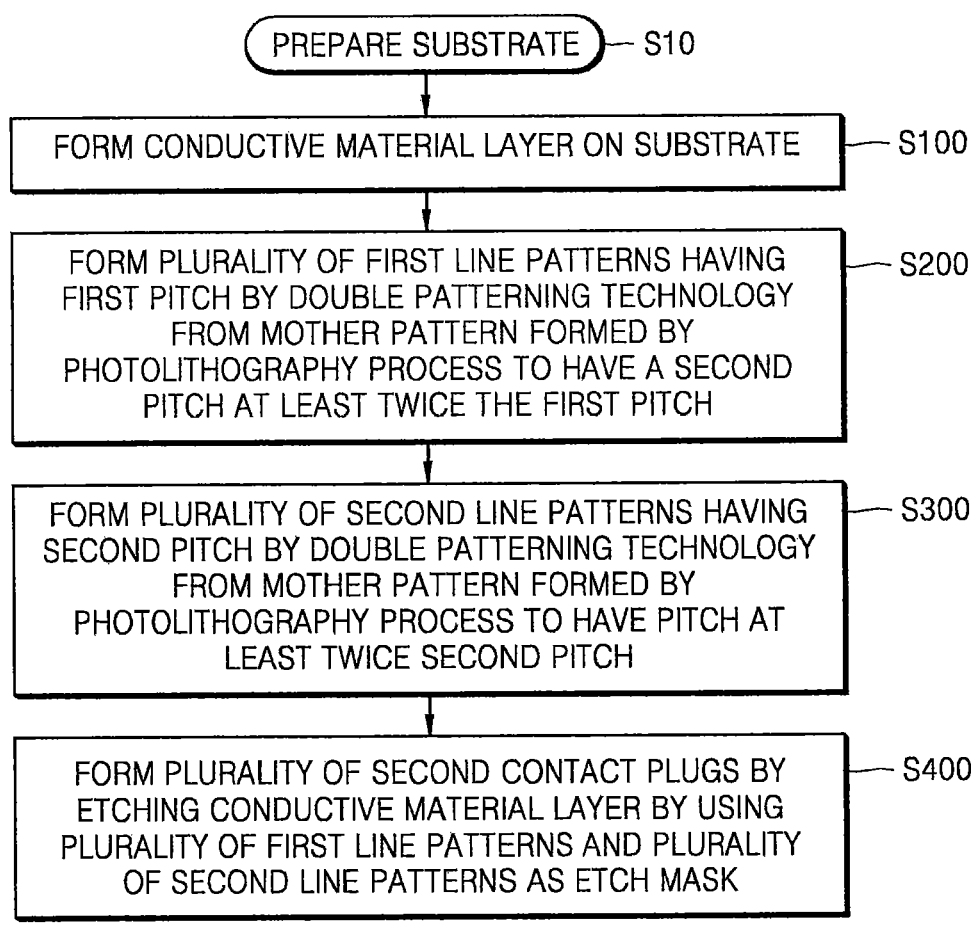
FIG. 14 is a flowchart illustrating a process of forming a second contact plug in methods of manufacturing semiconductor devices, according to some embodiments.

FIG. 14 is a flowchart illustrating the process of forming the second contact plug LP in methods of manufacturing semiconductor devices in some embodiments. In detail, FIG. 14 is a flowchart illustrating methods of forming semiconductor devices, illustrated in FIGS. 5 through 13B.

Referring to FIGS. 5 through 13B, and 14, the substrate 110 on which the active areas 110A or ACT, the word lines 122 or WL, the direct contacts DC, the bit line structure 160s or BLS, the contact holes CH, and the first contact plugs BC are formed is prepared in operation S10.

The conductive material layer 210 filling the plurality of contact holes CH and covering the plurality of bit line structures 160 is formed on the substrate 110, in operation S100.

The plurality of first line patterns 310 having the first pitch P1 are formed on the conductive material layer 210 by a double patterning process from the mother pattern formed by a photolithography process to have the pitch that is at least twice that of the first pitch P1, in operation S200.

The plurality of second line patterns 320 having the second pitch P2 are formed on the conductive material layer 210 by a double patterning process from the mother pattern formed by a photolithography process to have the pitch that is at least two times greater than the second pitch P2, in operation S300.

The plurality of second contact plugs LP electrically connected with the plurality of first contact plugs BC, respectively, are formed by etching the conductive material layer 210 by using the plurality of first line patterns 310 and the plurality of second line patterns 320 as an etch mask, in operation S400.

Figure 15:
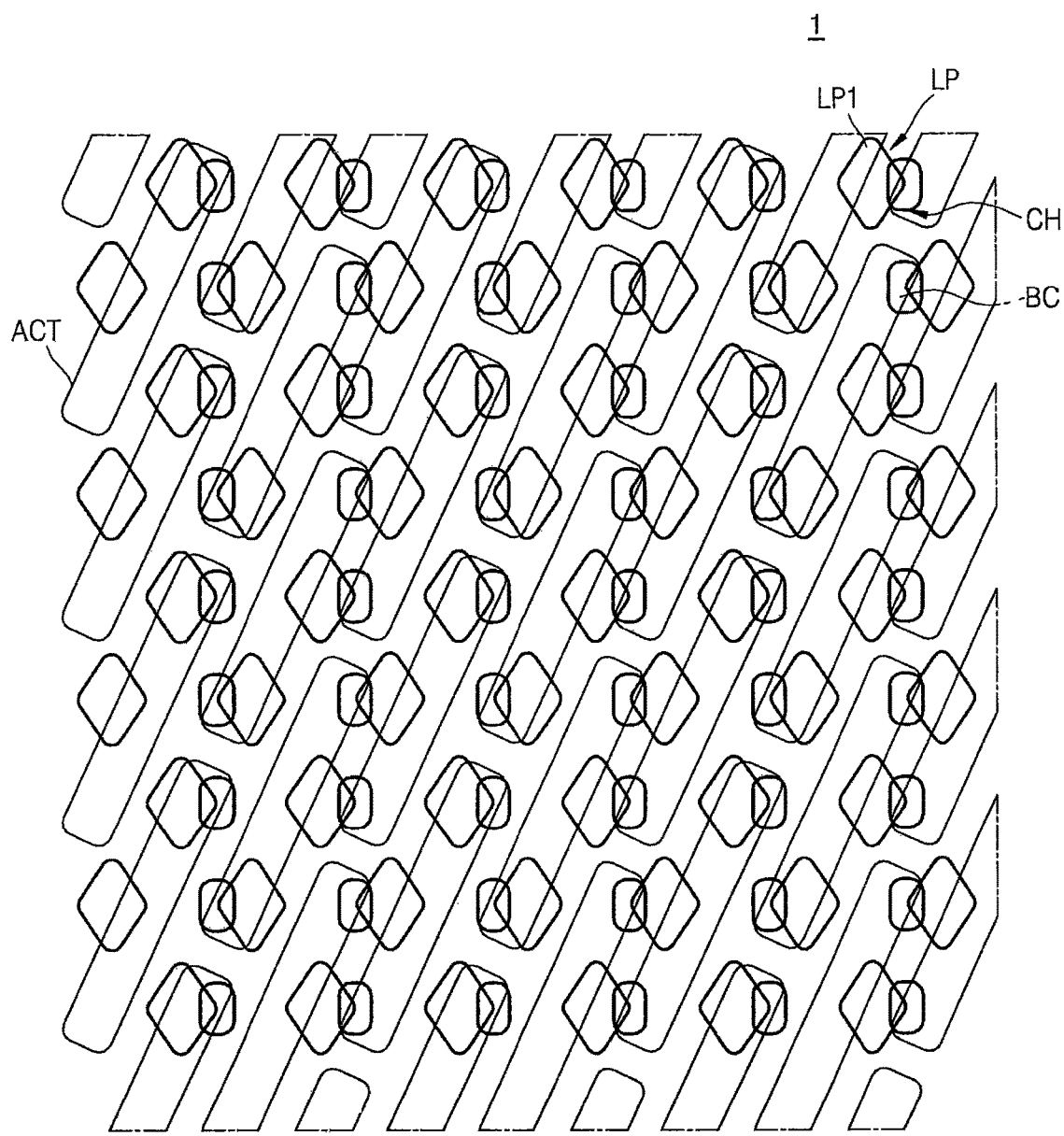
FIG. 15 is a layout of some elements of a semiconductor device according to some embodiments.

FIG. 15 is a layout of some elements of the semiconductor device 1. In detail, FIG. 15 is a layout of FIG. 1, in which some elements of FIG. 1 are omitted.

Referring to FIG. 15, the semiconductor device 1 includes the plurality of active areas ACT. Each of the plurality of active areas ACT may have a relatively long island shape with a minor axis and a major axis. Each of the plurality of active areas ACT may have a major axis extending in the diagonal direction with respect to the first direction (direction x).

The plurality of buried contacts BC, that is, the plurality of first contact plugs BC, may have a matrix array structure which is arranged in series along the first direction (direction x) and the second direction (direction y). In some embodiments, the plurality of first contact plugs BC may be arranged at equal intervals in the first direction (direction x). One active area ACT may be electrically connected with two first contact plugs BC.

The plurality of landing pads LP, that is, the plurality of second contact plugs LP, may be electrically connected with the plurality of first contact plugs BC. The body portions LP1 of the plurality of second contact plugs LP may be arranged to have a hexagonal array structure.

The body portion LP1 of the second contact plug LP may have a diamond shaped cross-sectional plane. The body portion LP1 of the second contact plug LP may have a diagonal line with respect to the diamond-shaped cross-sectional plane, the diagonal line extending along the first direction (direction x). The body portion LP1 of the second contact plug LP may have another diagonal line with respect to the diamond-shaped cross-sectional plane, the diagonal line extending along the second direction (direction y). The two diagonal lines of the body portion LP1 of the second contact plug LP with respect to the diamond-shaped cross-sectional plane may have different lengths. The cross-sectional plane of the body portion LP1 of the second contact plug LP may have a round-edged diamond shape.

The body portion LP1 of the second contact plug LP may overlap a portion of the contact hole CH. That is, the body portion LP1 of the second contact plug LP may overlap a portion of the first contact plug BC filling the contact hole CH.

Figure 16:
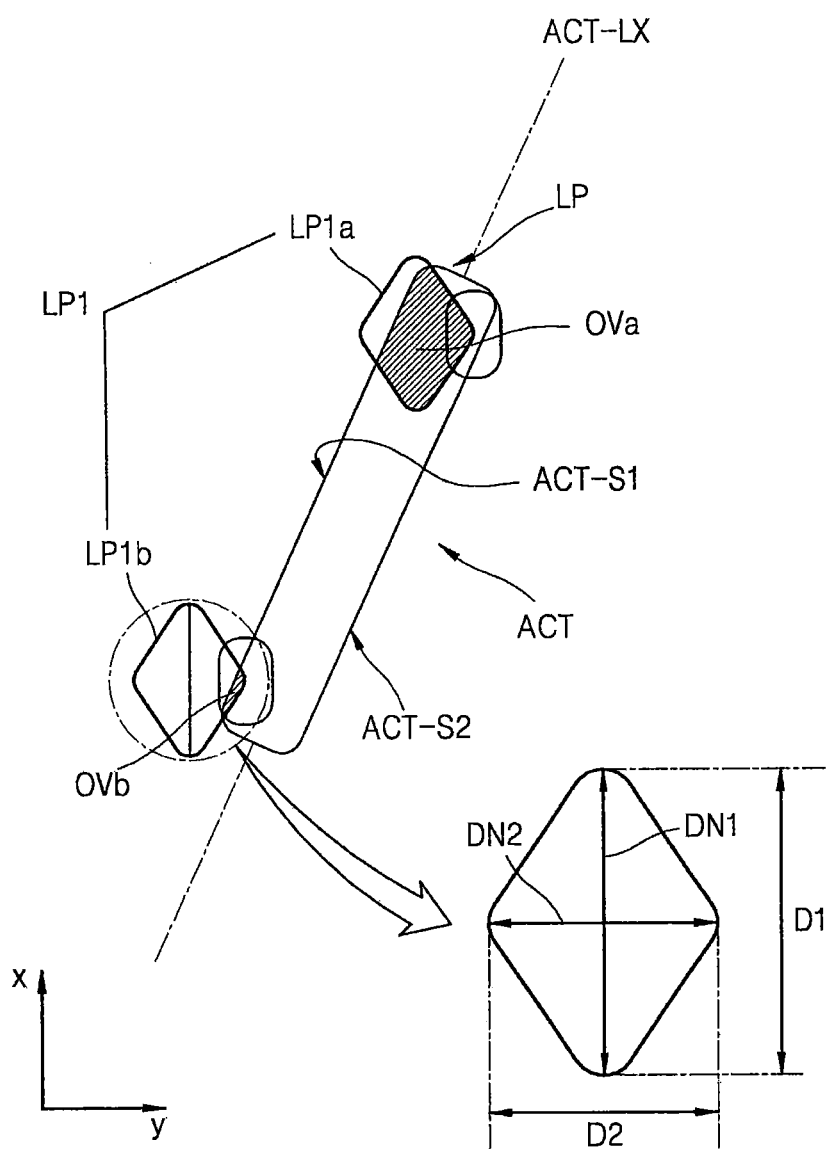
FIG. 16 is a layout of some elements of a semiconductor device according to some embodiments.

FIG. 16 is a layout of some elements of the semiconductor device 1. In detail, FIG. 16 is a layout of one active area of FIG. 1 and the first and second contact plugs BC and LP corresponding to the active area.

Referring to FIG. 16, the semiconductor device 1 includes the active area ACT. The active area ACT may have a relatively long island shape with a minor axis and a major axis. The active area ACT may have a major axis extending along a diagonal direction with respect to the first direction (direction x).

The body portion LP1 of the second contact plug LP may have a diamond shaped cross-sectional plane. The body portion LP1 of the second contact plug LP may have a round-edged diamond shaped cross-sectional plane.

The body portion LP1 of the second contact plug LP may have a diagonal line DN1 with respect to the diamond-shaped plane cross-section, the diagonal line extending along the first direction (direction x), and another diagonal line DN2 extending along the second direction (direction y). A first length D1 and a second length D2 of the two diagonal lines DN1 and DN2 of the body portion LP1 of the second contact plug LP, respectively, with respect to the diamond-shaped cross-sectional plane, may be different from each other. In some embodiments, the first length D1 may be greater than the second length D2.

As described above, since the edges of the diamond shape may be partially removed during the etching process, the body portion LP1 of the second contact plug LP may have a round-edged diamond shaped cross-sectional plane. Also, when the edges of the diamond shape are subjected to additional etching, the cross-sectional plane of the body portion LP1 of the second contact plug LP may have an oval shape. In this case, a major axis of the oval shape may be along the first direction (direction x).

The active area ACT may be electrically connected with two first contact plugs BC corresponding to the active area ACT. The active area ACT may be electrically connected with two second contact plugs LP corresponding to the active area ACT. Each of the two second contact plugs LP corresponding to the active area ACT may be electrically connected with the active area ACT through each different one of the two first contact plugs BC corresponding to the active area ACT.

The body portions LP1 of the two second contact plugs LP corresponding to (overlapping) the active area ACT may have different size areas overlapping the active area ACT. A first body portion LP1a and a second body portion LP1b, that is, the body portions LP1 corresponding to the active area ACT, may have a first area OVa and a second area OVb, respectively, which overlap the active area ACT. The first area OVa and the second area OVb may have different values.

The active area ACT may have a major axis ACT-LX extending along a diagonal direction with respect to the first direction (direction x). The first body portion LP1a and the second body portion LP1b, corresponding to the active area ACT, may overlap an identical side surface ACT-S1 of the active area ACT, from among two side surfaces ACT-S1 and ACT-S2 thereof, the two side surfaces being based on the major axis ACT-LX of the active area ACT.

Each of the two first contact plugs BC corresponding to the active area ACT may overlap a different side surface ACT-S1 or ACT-S2, based on the major axis ACT-LX of the active area ACT.

The two first contact plugs BC corresponding to the active area ACT may have a symmetrical shape based on the center of the active area ACT. Here, the center of the active area ACT denotes a planar center of the active area ACT. The two first contact plugs BC corresponding to the active area ACT may have a 180° rotational symmetry based on the center of the active area ACT. The two second contact plugs LP corresponding to the active area ACT may have an asymmetrical shape based on the center of the active area ACT. The two second contact plugs LP corresponding to the active area ACT may have a shape which is shifted toward a different direction from the direction of the major axis ACT-LX of the active area ACT.

The first body portion LP1a of the body portions LP1 of the two second contact plugs LP corresponding to the active area ACT, and the first contact plug BC connected with the first body portion LP1 may overlap different side surfaces ACT-S1 and ACT-S2 based on the major axis ACT-LX of the active area ACT. The second body portion LP1b of the body portions LP1 of the two second contact plugs LP corresponding to the active area ACT, and the first contact plug BC connected with the second body portion LP1b may overlap the identical side surface ACT-S1 based on the major axis ACT-LX of the active area ACT.

The second body portion LP1b, which overlaps the identical side surface ACT-S1 of the active area ACT with the first contact plug BC connected with the second body portion LP1b, from among the body portions LP1 corresponding to the active area ACT, may have a smaller area OVb overlapping the active area ACT than an area OVa of the first body portion LP1a, which overlaps the different side surface ACT-S1 or ACT-S2 to the first contact plug BC.

Figure 17:
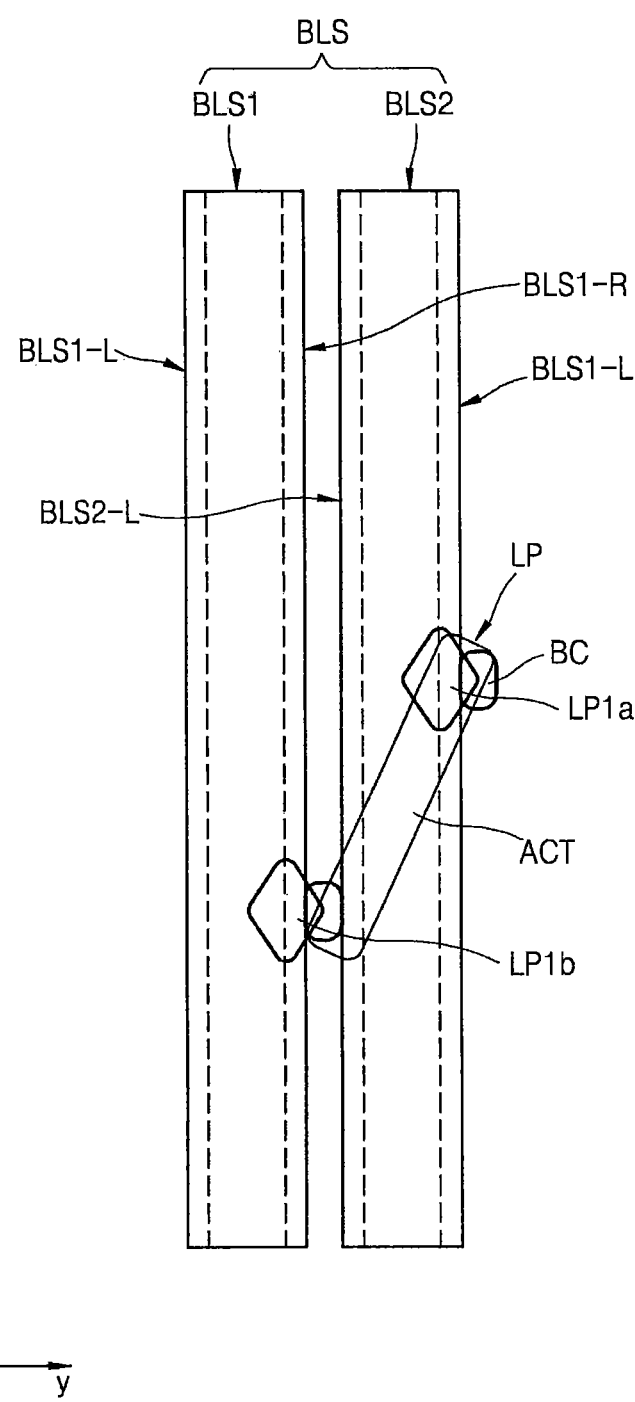
FIG. 17 is a layout of some elements of a semiconductor device according to some embodiments.

FIG. 17 is a layout of some elements of the semiconductor device 1. In detail, FIG. 17 is a layout of one active area of FIG. 1, the first and second contact plugs BC and LP corresponding to the active area, and portions of the bit line structures BLS.

Referring to FIG. 17, the semiconductor device 1 includes the active area ACT, the bit line structures BLS, the first contact plugs BC, and the second contact plugs LP.

The first and second body portions LP1a and LP1b may be arranged on different (adjacent) bit line structures BLS. The first and second body portions LP1a and LP1b may be arranged to overlap corresponding side surfaces of the different bit line structures BLS. In some embodiments, the two second contact plugs LP may be arranged on two adjacent bit line structures BLS, respectively.

Figure 18:
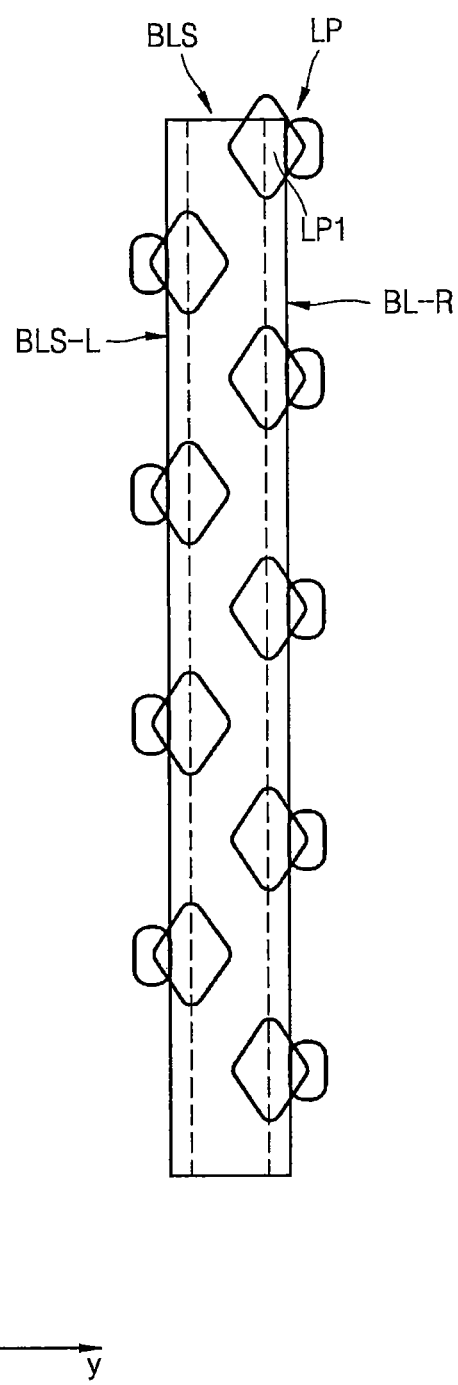
FIG. 18 is a layout of some elements of a semiconductor device according to some embodiments.

FIG. 18 is a layout of some elements of the semiconductor device 1. In detail, FIG. 18 is a layout of one bit line structure BLS of FIG. 1, and the body portions LP1 of the second contact plugs LP, which are formed on the bit line structure BLS.

Referring to FIG. 18, the semiconductor device 1 includes the bit line structure BLS and the second contact plugs LP. The second contact plugs LP may be alternately arranged (i.e., staggered) such that the second contact plugs LP alternately overlap opposing side surfaces BLS-L and BLS-R of the bit line structure BLS in the first direction (direction x). The body portions LP1 may be alternately arranged to overlap the opposing surfaces BLS-L and BLS-R of the bit line structure BLS in the first direction (direction x).

Figure 19:
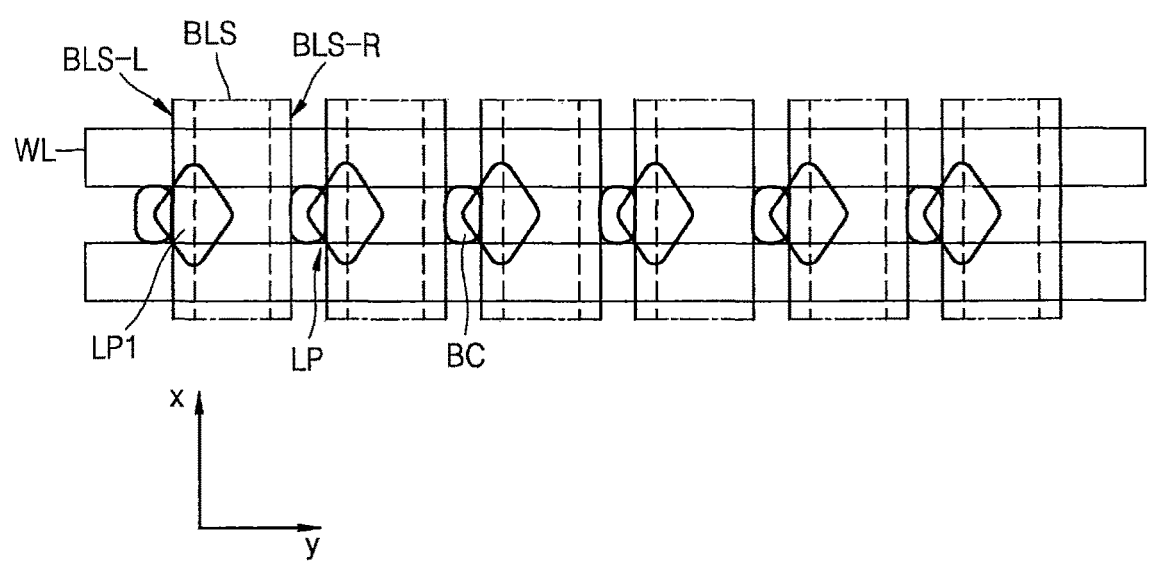
FIG. 19 is a layout of some elements of a semiconductor device according to some embodiments.

FIG. 19 is a layout of some elements of the semiconductor device 1. In detail, FIG. 19 is a layout of the body portions LP1 of the second contact plugs LP arranged to form a row in the second direction, portions of the bit line structures BLS, and portions of the word lines WL of FIG. 1.

Referring to FIG. 19, the semiconductor device 1 includes the word lines WL, the bit line structures BLS, the first contact plugs BC, and the second contact plugs LP.

The second contact plugs LP may be arranged to form the row in the second direction (direction y) which is perpendicular to the first direction (direction x). The second contact plugs LP may be arranged to overlap corresponding side surfaces BLS-L of adjacent bit line structures BLS.

Although it is illustrated in FIG. 19 that the second contact plugs LP are arranged to overlap the left side surfaces BLS-L of the bit line structures BLS, the second contact plugs LP may be arranged to overlap the right side surfaces BLS-R of the bit line structures BLS, as illustrated in FIG. 1.

Figure 20:
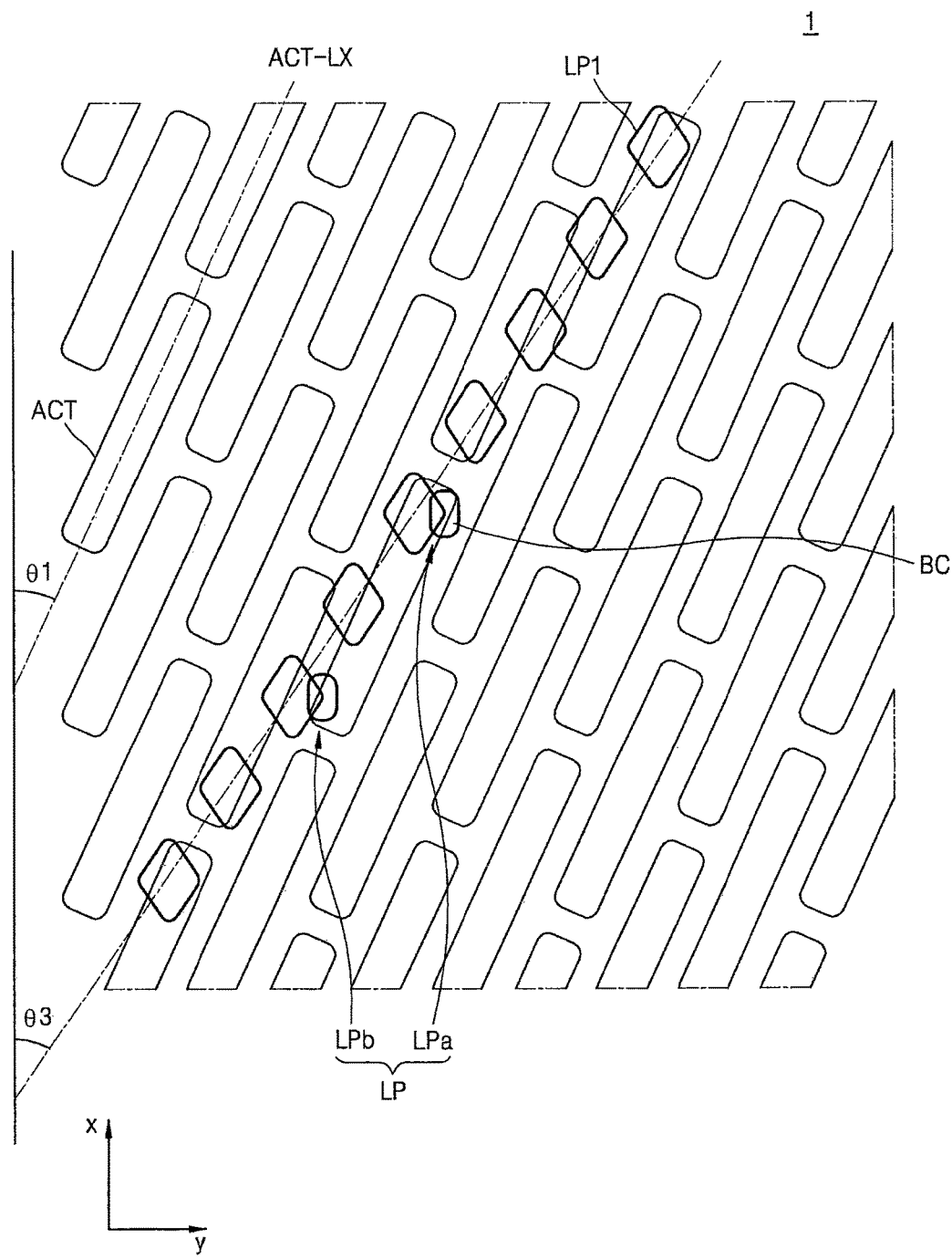
FIG. 20 is a layout of some elements of a semiconductor device according to some embodiments.

FIG. 20 is a layout of some elements of the semiconductor device 1. In detail, FIG. 20 is a layout of portions of the body portions LP1 of the second contact plugs LP and the plurality of active areas ACT of FIG. 1.

Referring to FIG. 20, the semiconductor device 1 includes the plurality of active areas ACT, the first contact plugs BC, and the second contact plugs LP.

A column formed by the body portions LP1 along an extension line connecting the body portions LP1 may be arranged along a direction that is different from a direction of the major axis ACT-LX of the active area ACT.

The major axis ACT-LX of the active area ACT may have a first angle $\theta1$ with respect to the first direction (direction x). The column formed by the body portions LP1 may extend by an angle that is greater than the first angle $\theta1$, with respect to the first direction (direction x).

The extension line connecting the body portions LP1 is along the same direction as a direction in which the second line patterns 320 of 9B extend. Accordingly, the extension line may extend by a third angle $\theta3$ with respect to the first direction (direction x), and the third angle $\theta3$ may be greater than the first angle $\theta1$.

Figure 21:
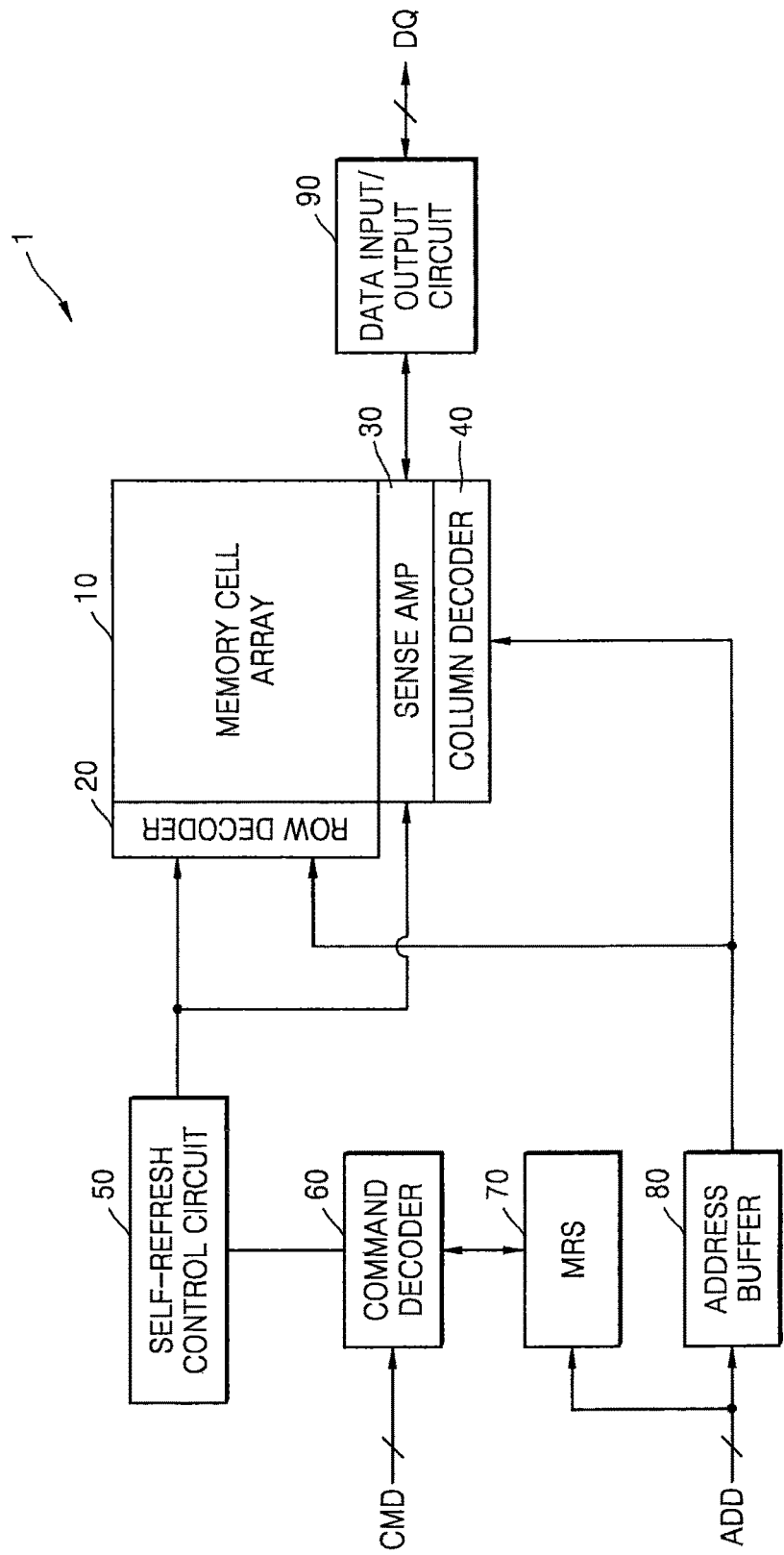
FIG. 21 is a block diagram of a semiconductor device according to some embodiments.

FIG. 21 is a block diagram of the semiconductor device 1.

Referring to FIG. 21, the semiconductor device 1 includes a memory cell array 10, a row decoder 20, a sense amplifier 30, a column decoder 40, a self-refresh control circuit 50, a command decoder 60, a mode register set/extended mode register set (MRS/EMRS) circuit 70, an address buffer 80, and a data input/output circuit 90.

A plurality of memory cells for storing data are arranged in a row and column direction in the memory cell array 10. The plurality of memory cells may be each formed of a cell capacitor and an access transistor. A gate of the access transistor may be connected with a corresponding word line from among a plurality of word lines arranged in the row direction. One of a source and a drain of the access transistor may be connected with a bit line BL or complementary bit line (/BL) arranged in the column direction, and the other may be connected with the cell capacitor. FIGS. 1 and 2 may correspond to the memory cell array 10 of the semiconductor device 1.

The sense amplifier 30 detects and amplifies data of the memory cell and stores the data in the memory cell. The sense amplifier 30 may be realized as a cross-coupled amplifier connected between the bit line BL and the complementary bit line /BL.

Data DQ input via the data input/output circuit 90 is written in the memory cell array 10 based on an address signal ADD, and data DQ read from the memory cell array 10 based on the address signal ADD is output via the data input/output circuit 90. The address signal ADD is input to the address buffer 80 to designate the memory cell to/from which the data is to be written/read. The address buffer 80 temporarily stores the address signal ADD.

The row decoder 20 decodes the row address output from the address buffer 80 and enables a corresponding word line in a data writing or reading mode. Also, the row decoder 20 decodes the row address generated from an address counter and enables a corresponding word line in a self-refresh mode.

The column decoder 40 decodes a column address among the address signal ADD output from the address buffer 80, to designate a bit line connected with the memory cell to/from which data is to be input/output.

The memory cell array 10 outputs data or writes data from/to the memory cell designated by the row and column addresses.

The command decoder 60 receives a command signal CMD applied from the outside and decodes the signal to generate a decoded command signal, such as a self-refresh entry command and a self-refresh exit command.

The MRS/EMRS circuit 70 sets a mode register inside the MRS/EMRS circuit 70 in response to an MRS/EMRS command and the address signal ADD designating an operation mode of the semiconductor device 1.

In addition, the semiconductor device 1 may further include a clock circuit for generating a clock signal and a power circuit for receiving a power voltage applied from the outside to generate or distribute an inner voltage.

The self-refresh control circuit 50 controls a self-refresh operation of the semiconductor device 1 in response to the command output from the command decoder 60.

The command decoder 60 may include an address counter, a timer, and a core voltage generating unit. The address counter may generate a row address for designating a row address which is to be the subject of the self-refresh operation and apply the row address to the row decoder 20, in response to the self-refresh entry command output from the command decoder 60. The address counter may end the counting operation in response to a self-refresh exit command output from the command decoder 60.

The memory cell array 10 and the sense amplifier 30 may form a memory core unit.

Figure 22:
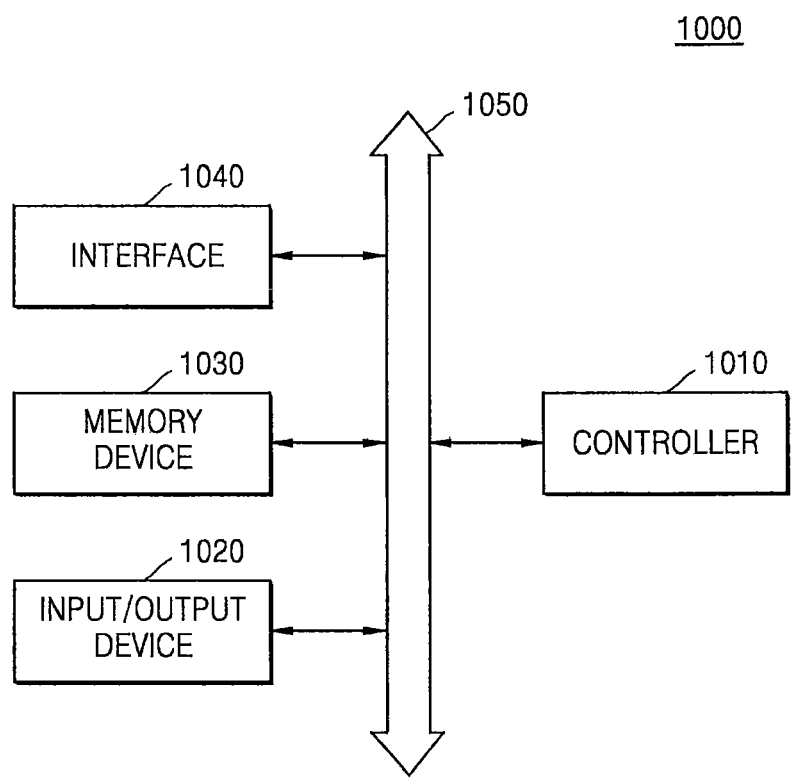
FIG. 22 is a diagram of a system including a semiconductor device according to some embodiments.

FIG. 22 is a diagram of a system 1000 including the semiconductor device 1.

Referring to FIG. 22, the system 1000 includes a controller 1010, an input/output device 1020, a memory device 1030, and an interface 1040. The system 1000 may be a system for transferring or receiving in a mobile system. In some embodiments, the mobile system may be a personal digital assistant (PDA), a portable computer, a web tablet, a wireless phone, a mobile phone, a digital music player, or a memory card. The controller 1010 is for controlling execution of a program included in the system 1000, and may be a microprocessor, a digital signal processor, a microcontroller, or a similar device. The input/output device 1020 may be used to input or output data of the system 1000. The system 1000 may be connected with an external device, such as, a personal computer (PC) or a network, by using the input/output device 1020, and may exchange data with the external device. The input/output device 1020 may be, for example, a keypad, a keyboard, or a display.

The memory device 1030 may store code and/or data for the operation of the controller 1010, or may store the data processed by the controller 1010. The memory device 1030 includes semiconductor devices according to embodiments of the inventive concept. For example, the memory device 1030 includes the semiconductor device 1 described with reference to FIGS. 1 through 20.

The interface 1040 may be a data transfer path between the system 1000 and other external devices. The controller 1010, the input/output device 1020, the memory device 1030, and the interface 1040 may communicate with one another via a bus 1050. The system 1000 may be used in a mobile phone, an MP3 player, a navigation device, a portable multimedia player (PMP), a solid state disk (SSD), and household appliances.

Figure 23:
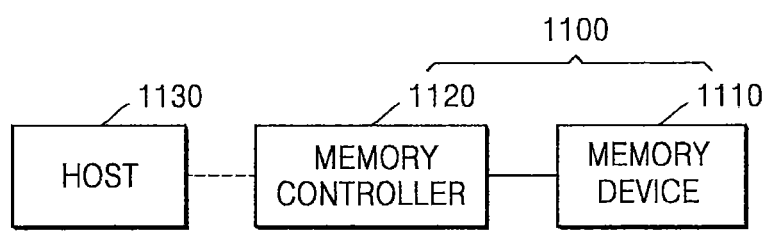
FIG. 23 is a diagram of a memory card including a semiconductor device according to some embodiments.

FIG. 23 is a diagram of a memory card 1100 including the semiconductor device 1.

Referring to FIG. 23, the memory card 1100 includes a memory device 1110 and a memory controller 1120.

The memory device 1110 may store data. In some embodiments, the memory device 1110 may have a nonvolatile characteristic which may retain stored data even if a power supply is removed from the memory device 1110. The memory device 1110 includes semiconductor devices according to embodiments of the inventive concept. For example, the memory device 1110 includes the semiconductor device 1 described with reference to FIGS. 1 through 20.

The memory controller 1120 may read data stored in the memory device 1110 or store data in the memory device 1110 in response to a read/write request of a host 1130.

While the inventive concept has been particularly shown and described with reference to exemplary embodiments thereof, it will be understood that various changes in form and details may be made therein without departing from the spirit and scope of the following claims.

What is claimed:

1. A semiconductor device comprising:
    a substrate having a plurality of active areas;
    a plurality of bit line structures formed on the substrate, each comprising a bit line extending in a first direction and a bit line spacer layer extending along two opposing side surfaces of the bit line;
    a plurality of contact holes spaced apart from one another in a lengthwise direction in a space between ones of the plurality of bit line structures;
    a plurality of first contact plugs filling respective bottom portions of the plurality of contact holes and electrically connected with respective ones of the plurality of active areas; and
    a plurality of second contact plugs electrically connected with respective ones of the plurality of first contact plugs, the plurality of second contact plugs being placed in a zigzag row along the first direction, and each comprising a body portion and an extension portion extending from the body portion into a respective one of the plurality of contact holes,
    wherein the body portions of two of the plurality of second contact plugs that correspond to one of the plurality of active areas, have different size areas that overlap a corresponding one of the plurality of active areas.

2. The semiconductor device of claim 1, wherein a plurality of body portions are alternately arranged to alternately overlap two opposing side surfaces of one of the bit line structure in the first direction.

3. The semiconductor device of claim 1, wherein each body portion overlaps a portion of a respective one of the plurality of bit line structures and overlaps a portion of a respective one of the plurality of contact holes, in a direction perpendicular to a main surface of the substrate.

4. The semiconductor device of claim 1, wherein the body portions of two of the plurality of second contact plugs that correspond to one of the plurality of active areas, are arranged on different ones of the plurality of bit line structures.

5. The semiconductor device of claim 4, wherein the body portions of two of the plurality of second contact plugs that correspond to one of the plurality of active areas, are arranged such that the body portions overlap side surfaces of an identical direction of the different bit line structures.

6. The semiconductor device of claim 1, wherein column portions of an extension line connecting two body portions corresponding to one of the plurality of active areas, is arranged along a different direction from a direction of a major axis of the one of the plurality of active areas.

7. The semiconductor device of claim 1, wherein each of the plurality of active areas has a major axis extending along a direction diagonal with respect to the first direction, and
   two body portions corresponding to one of the plurality of active areas, overlap an identical side surface of the one of the plurality of active areas, the two opposing side surfaces of the bit line being based on the major axis.

8. The semiconductor device of claim 1, wherein the plurality of second contact plugs are arranged to form a column along a second direction which is perpendicular to the first direction, and
   the plurality of second contact plugs arranged in the column are arranged to overlap different side surfaces of the plurality of bit line structures oriented in an identical direction.

9. The semiconductor device of claim 1, further comprising a plurality of storage nodes each formed on the plurality of second contact plugs, respectively, and laid out in the hexagonal array structure with respect to a main surface of the substrate,
   wherein respective areas of lower surfaces of the plurality of storage nodes are greater than areas of respective upper surfaces of the plurality of second contact plugs.

10. The semiconductor device of claim 1, wherein two of the plurality of first contact plugs corresponding to one of the plurality of active areas, have symmetrical positions with respect to a center of the one of the plurality of active areas, and
    two of the plurality of second contact plugs corresponding to one of the plurality of active areas, have asymmetrical positions with respect to the center of the one of the plurality of active areas.

11. The semiconductor device of claim 1, wherein each of the second contact plugs has a diamond-shaped cross-sectional plane, and
    wherein the diamond-shaped cross-sectional plane is included in the body portion.

12. The semiconductor device of claim 11, wherein a diagonal line of the body portion with respect to the diamond-shaped cross-sectional plane extends in the first direction.

13. The semiconductor device of claim 12, wherein lengths of two diagonal lines of the body portion with respect to the diamond-shaped cross-sectional plane are different from each other.

14. The semiconductor device of claim 11, wherein the cross-sectional plane of the body portion has a round-edged diamond shape.

15. The semiconductor device of claim 13, wherein three of four edges of the diamond-shaped cross-sectional plane of the body portion overlap the respective one of the plurality of bit line structures.

16. A semiconductor device comprising:
    a substrate having a plurality of active areas;
    a plurality of bit line structures formed on the substrate, each comprising a bit line extending in a first direction and a bit line spacer layer extending along two side surfaces of the bit line;
    a plurality of first contact plugs spaced apart from one another in a lengthwise direction of a space between ones of the plurality of bit line structures, and electrically connected with respective ones of the plurality of active areas; and
    a plurality of second contact plugs electrically connected with respective ones of the plurality of first contact plugs and on respective ones of the plurality of bit line structures,
    wherein the plurality of second contact plugs overlap respective portions of the plurality of bit line structures and respective portions of the plurality of first contact plugs in the direction perpendicular to the main surface of the substrate, and
    respective portions of the plurality of second contact plugs, which are arranged on upper surfaces of the respective ones of the plurality of bit line structures to have an area that overlaps the plurality of bit line structures, which is greater than an area thereof overlapping the plurality of first contact plugs.

17. The semiconductor device of claim 16, wherein the two from among the plurality of second contact plugs, corresponding to the one from among the plurality of active areas, are arranged on two adjacent bit line structures, respectively.

18. The semiconductor device of claim 16, wherein a cross-sectional plane of the second contact plugs on upper surfaces of the plurality of bit line structures has a round edged diamond shape.

19. A semiconductor device comprising:
    a substrate having a plurality of active areas;
    a plurality of bit line structures formed on the substrate, each comprising a bit line extending in a first direction and a bit line spacer layer extending along two opposing side surfaces of the bit line;
    a plurality of contact holes spaced apart from one another in a lengthwise direction in a space between ones of the plurality of bit line structures;
    a plurality of first contact plugs filling respective bottom portions of the plurality of contact holes and electrically connected with respective ones of the plurality of active areas, each of the plurality of first contact plugs having a first planar center;
    a plurality of second contact plugs electrically connected with respective ones of the plurality of first contact plugs, the plurality of second contact plugs each comprising a body portion and an extension portion extending from the body portion into a respective one of the plurality of contact holes, the body portion having a second planar center; and
    a plurality of storage nodes connected with respective ones of the plurality of second contact plugs, each of the plurality of storage nodes having a third planar center;
    wherein the third planar center is offset from the first planar center and the third planar center is aligned with the second planar center.

20. The semiconductor device of claim 19, wherein the first planar center and the third planar center are staggered from each other in a second direction which is perpendicular to the first direction.

\* \* \* \* \*